(12) United States Patent
Park et al.

(10) Patent No.: US 12,230,337 B2
(45) Date of Patent: Feb. 18, 2025

(54) NON-VOLATILE MEMORY DEVICE HAVING A FUSE TYPE MEMORY CELL ARRAY

(71) Applicant: SK keyfoundry Inc., Cheongju-si (KR)

(72) Inventors: Seongjun Park, Suwon-si (KR); Soyeon Kim, Seoul (KR); Sungbum Park, Seongnam-si (KR); Keesik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 100 days.

(21) Appl. No.: 18/096,788

(22) Filed: Jan. 13, 2023

(65) Prior Publication Data

US 2023/0402116 A1 Dec. 14, 2023

(30) Foreign Application Priority Data

Jun. 13, 2022 (KR) .................. 10-2022-0071268

(51) Int. Cl.
*G11C 17/00* (2006.01)
*G11C 7/24* (2006.01)
*G11C 17/16* (2006.01)
*G11C 17/18* (2006.01)

(52) U.S. Cl.
CPC .............. *G11C 17/16* (2013.01); *G11C 7/24* (2013.01); *G11C 17/18* (2013.01)

(58) Field of Classification Search
CPC ....... G11C 17/16; G11C 11/401; G11C 17/18; G11C 2029/1208; G11C 29/00; G11C 29/785; G11C 29/787; G11C 29/83; G11C 7/06; G11C 7/08; G11C 7/1012; G11C 7/1063; G11C 7/109; G11C 7/1096; G11C 7/12; G11C 7/18; G11C 8/08; G11C 8/14; G11C 16/26; G11C 16/3427; G11C 29/78; G11C 29/835; G11C 7/04

See application file for complete search history.

(56) References Cited

U.S. PATENT DOCUMENTS

| | | |
|---|---|---|
| 8,488,359 B2 | 7/2013 | Chung |
| 8,514,606 B2 | 8/2013 | Chung |
| 8,760,904 B2 | 6/2014 | Chung |
| 8,913,415 B2 | 12/2014 | Chung |
| 10,249,379 B2 | 4/2019 | Chung |
| 11,145,379 B2 * | 10/2021 | Cho .................. H01L 23/5252 |

FOREIGN PATENT DOCUMENTS

| KR | 10-2015-0057382 A | 5/2015 |
|---|---|---|
| KR | 10-2342532 B1 | 12/2021 |

OTHER PUBLICATIONS

Korean Office Action issued on Nov. 16, 2023, in counterpart Korean Patent Application No. 10-2022-0071268 (5 pages in English, 5 pages in Korean).

* cited by examiner

*Primary Examiner* — Thong Q Le
(74) *Attorney, Agent, or Firm* — NSIP Law

(57) ABSTRACT

A memory device includes an eFuse cell array in which unit cells of different types are alternately disposed, and each of the unit cells of different types includes a PN diode, a first NMOS transistor, and a fuse, wherein a first type unit cell and a second type unit cell are connected to each other through a common node, and the first type unit cell and the second type unit cell are disposed in a bilaterally symmetrical structure with respect to the common node.

20 Claims, 14 Drawing Sheets

NON-VOLATILE MEMORY DEVICE HAVING A FUSE TYPE MEMORY CELL ARRAY

CROSS-REFERENCE TO RELATED APPLICATIONS

The present application claims the benefit under 35 U.S.C. 119(a) of Korean Patent Application No. 10-2022-0071268 filed on Jun. 13, 2022, the entire disclosure of which is incorporated herein by reference for all purposes.

BACKGROUND

1. Field

The following description relates to a non-volatile memory device having a fuse type cell array.

2. Description of the Related Art

Power integrated circuits (ICs) such as Power Management IC (PMIC) devices may require a small capacity of a non-volatile One Time Programmable (OTP) memory to perform analog trimming functions. For the small capacity of non-volatile OTP memory, an electrical-fuse type (hereinafter, referred to as an eFuse) One Time Programmable memory having a simple driving method and a small area is provided. Such an eFuse type OTP memory is programmed in such a manner as to blow the eFuse by using an overcurrent of about 10 mA to 30 mA in a polysilicon fuse or a metal fuse.

In order to blow the eFuse using the program current of about 10 mA to 30 mA as above, a MOS transistor having a channel width of a predetermined value or more needs to be included in each unit cell constituting a memory cell array. However, due to the MOS transistor, the area of each unit cell disadvantageously increases, which may lead to an increase in the overall size of the OTP memory device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Accordingly, various embodiments of the present disclosure disclose a non-volatile memory device including a fuse-type cell array having a small area.

Various embodiments of the present disclosure disclose a non-volatile memory device including a discharge circuit for a common node for each column of a fuse-type cell array.

In one general aspect, a memory device may include an eFuse cell array in which unit cells of different types are alternately disposed, and each of the unit cells of different types may include a PN diode, a first NMOS transistor, and a fuse, wherein a first type unit cell and a second type unit cell may be connected to each other through a common node, and the first type unit cell and the second type unit cell may be disposed in a bilaterally symmetrical structure with respect to the common node.

The first type unit cell and the second type unit cell disposed in a bilaterally symmetrical structure with respect to the common node may be connected to a same bit line.

A p-type guard ring disposed to surround the first type unit cell and the second type unit cell may be further included.

The fuse may be connected between the common node and a first node. The first NMOS transistor may comprise a gate terminal connected to a read word line (RWL), a drain terminal connected to a bit line, and a source terminal connected to the first node. The PN diode may comprise an anode connected to the fuse through the first node and a cathode connected to a write word line bar (WWLB), wherein the RWL may be a line configured to receive a RWL signal indicating whether a read word line is activated, and the WWLB may be a line configured to receive a WWLB signal obtained by inverting a write word line (WWL) signal indicating whether a write word line is activated.

A first PMOS transistor disposed outside the unit cells and configured to supply a program current to the first type unit cell and the second type unit cell through the common node is further included, wherein the first PMOS transistor may comprise a gate terminal connected to a line configured to receive a BLOWB signal obtained by inverting a fuse blowing signal, a source terminal connected to a power supply voltage, and a drain terminal connected to the common node.

A second NMOS transistor disposed outside the unit cells and configured to operatively connect the first type unit cell and the second type unit cell to a ground through the common node is further included, wherein the second NMOS transistor may comprise a gate terminal connected to a line configured to receive an RD signal indicating whether a read mode is present, a drain terminal connected to the common node, and a source terminal connected to the ground.

A program driver configured to supply a program current to the common node of a selected column among columns of the eFuse cell array, and a sense amplifier configured to read data of any one unit cell among unit cells of the selected column based on a voltage of a bit line of the selected column may be further included.

A common node discharge circuit configured to discharge a voltage charged in the common node based on control signals according to an operation mode of the memory device may be further included.

The control signal may include an RD signal provided from the sense amplifier and indicating whether a read mode is present, and a BLOWB signal obtained by inverting a fuse blowing signal.

The common node discharge circuit may include a first inverter configured to invert the RD signal and output an inversion signal of the RD signal, and a NAND gate configured to perform a NAND operation on the inversion signal of the RD signal provided from the first inverter and the BLOWB signal, a second inverter configured to invert an output signal of the NAND gate, and a third NMOS transistor including a gate terminal connected to an output terminal of the second inverter, a drain terminal connected to the common node, and a source terminal connected to a ground, and configured to be turned on/off according to an output signal of the second inverter.

When the operation mode of the memory device is a standby mode or a '0' program mode, the common node discharge circuit may be configured to discharge the voltage charged in the common node by turning on the third NMOS transistor.

When the operation mode of the memory device is a standby mode or a '0' program mode, the RD signal may be a low level and the BLOWB signal may be a high level.

The common node discharge circuit may be disposed outside the unit cells.

In another general aspect, a memory device may include an eFuse cell array including unit cells, a program driver configured to supply a program voltage to a common node having a connection with unit cells of a selected column among columns of the eFuse cell array, and a common node discharge circuit configured to discharge a voltage charged in the common node by the program voltage based on control signals according to an operation mode of the memory device.

The control signal may include an RD signal indicating whether a read mode is present, and a BLOWB signal obtained by inverting a fuse blowing signal.

The common node discharge circuit may include a first inverter configured to invert the RD signal and output an inversion signal of the RD signal, a NAND gate configured to perform a NAND operation on the inversion signal of the RD signal provided from the first inverter and the BLOWB signal, and a second inverter configured to invert an output signal of the NAND gate, and a third NMOS transistor including a gate terminal connected to an output terminal of the second inverter, a drain terminal connected to the common node, and a source terminal connected to a ground, and configured to be turned on/off according to an output signal of the second inverter.

When the operation mode of the memory device is a standby mode or a '0' program mode, the common node discharge circuit may be configured to discharge the voltage charged in the common node by turning on the third NMOS transistor.

When the operation mode of the memory device is a standby mode or a '0' program mode, the RD signal may be a low level and the BLOWB signal may be a high level.

The common node discharge circuit may be disposed outside the unit cells.

Each of the plurality of unit cells may include: a fuse connected between the common node and a first node, a first NMOS transistor including a gate terminal connected to a read word line (RWL), a drain terminal connected to a bit line, and a source terminal connected to the first node; and a PN diode including an anode connected to the fuse through the first node and a cathode connected to a write word line bar (WWLB), wherein the RWL may be a line configured to receive a RWL signal indicating whether a read word line is activated, and the WWLB may be a line configured to receive a WWLB signal obtained by inverting a write word line (WWL) signal indicating whether a write word line is activated.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and conveniences.

DETAILED DESCRIPTION

Figure 1:
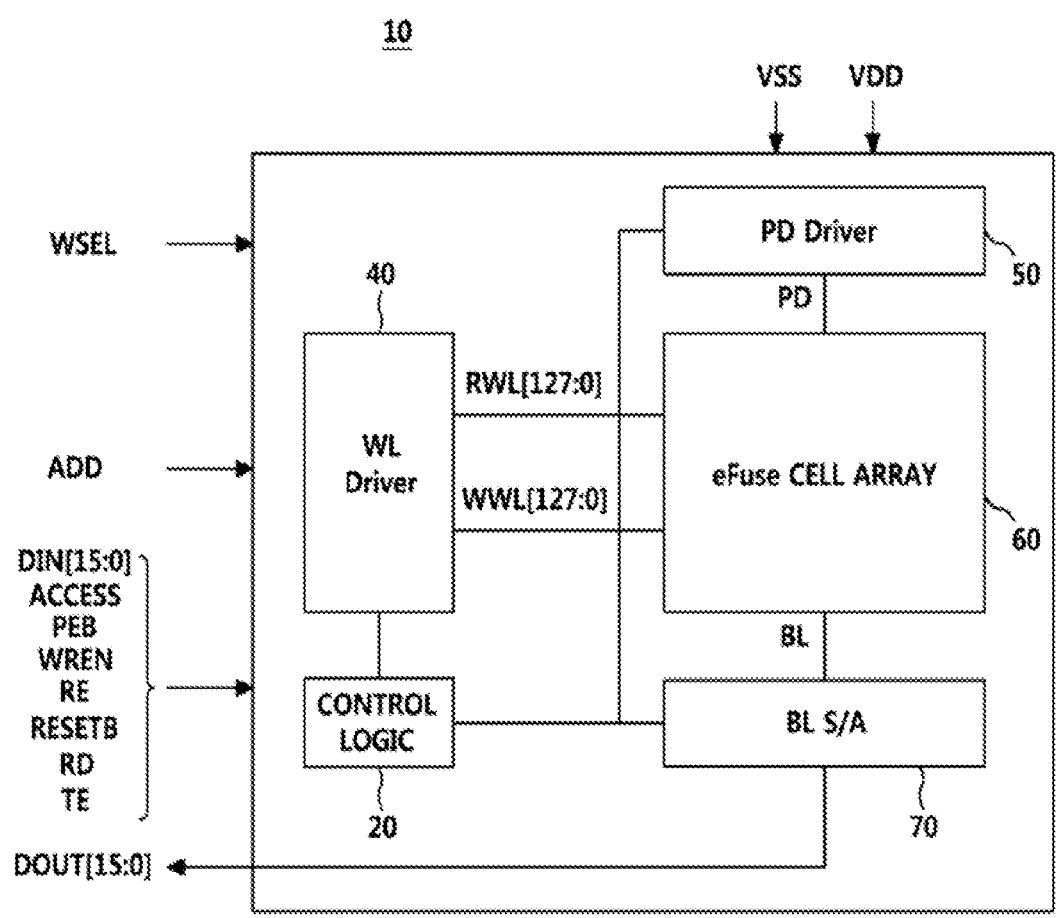
FIG. 1 illustrates a block diagram of an exemplary non-volatile memory device having a fuse-type cell array according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features, advantages and method for accomplishment of the present invention will be more apparent from referring to the following detailed embodiments described as well as the accompanying drawings. However, the present invention is not limited to the embodiment to be disclosed below and is implemented in different and various forms. The embodiments bring about the complete disclosure of the present invention and are provided to make those skilled in the art fully understand the scope of the present invention. The present invention is just defined by the scope of the appended claims. The same or similar reference numerals throughout the disclosure may be used for the same or similar components.

What one component is referred to as being "connected to" or "coupled to" another component includes both a case where one component is directly connected or coupled to another component and a case where a further another component is interposed between them. Meanwhile, what one component is referred to as being "directly connected to" or "directly coupled to" another component indicates that a further another component is not interposed between them. The term "and/or" includes each of the mentioned items and one or more all of combinations thereof.

Terms used in the present specification are provided for description of only specific embodiments of the present invention, and not intended to be limiting. In the present specification, an expression of a singular form includes the expression of plural form thereof if not specifically stated. The terms "comprises" and/or "comprising" used in the specification is intended to specify characteristics, numbers, steps, operations, components, parts or any combination thereof which are mentioned in the specification, and intended not to exclude the existence or addition of at least one another characteristics, numbers, steps, operations, components, parts or any combination thereof.

While terms such as the first and the second, etc., can be used to describe various components, the components are not limited by the terms mentioned above. The terms are used only for distinguishing between one component and other components.

Therefore, the first component to be described below may be the second component within the spirit of the present invention. Unless differently defined, all terms used herein including technical and scientific terms have the same meaning as commonly understood by one of ordinary skill in the art to which the present invention belongs. Also, commonly used terms defined in the dictionary should not be ideally or excessively construed as long as the terms are not clearly and specifically defined in the present application.

A term "part" or "module" used in the embodiments may mean software components or hardware components such as a field programmable gate array (FPGA), or an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present invention may be directly implemented by hardware and software modules that are executed by a processor or may be directly implemented by a combination of the two. The software module may be resident on a RAM, a flash memory, a ROM, an EPROM, an EEPROM, a resistor, a hard disk, a removable disk, a CD-ROM, or any other type of record medium known to those skilled in the art. A record medium is coupled to a processor and the processor can read information from the record medium and can record the information in a storage medium. In another way, the record medium may be integrally formed with the processor. The processor and the record medium may be resident within an application specific integrated circuit (ASIC).

FIG. 1 is a block diagram of an exemplary non-volatile memory device having a fuse-type cell array according to one or more embodiments of the present disclosure. In various embodiments of the present disclosure, the "fuse" may refer to an electrical fuse (an eFuse), and the "non-volatile memory device having a fuse-type cell array" may refer to an eFuse type one time programmable memory (OTP) memory. The "eFuse type" may refer to a method of programming binary information by blowing a fuse by applying a high voltage to the fuse of each unit cell or maintaining the fuse without blowing it. The configuration of a non-volatile memory device 10 illustrated in FIG. 1 is merely an example for describing embodiments of the present disclosure, and the non-volatile memory device 10 of the present disclosure is not limited thereto. For example, the non-volatile memory device 10 may further include at least one other component in addition to the components illustrated in FIG. 1, or at least one component illustrated in FIG. 1 may be replaced with another component.

Referring to FIG. 1, the non-volatile memory device 10 may include a control logic 20, a word line driver WL Driver 40, a programming driver PD Driver 50, and an eFuse cell array 60, and a bit line sense amplifier BL S/A 70. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The control logic 20 may generate an internal control signal suitable for a program mode or a read mode based on an external control signal input through an input terminal, and supply the generated control signal to the word line driver 40, the programming driver 50, and the bit line sense amplifier 70. The input terminals may include, for example, a DIN [15:0] terminal, an ACCESS terminal, a PEB terminal, a WREN terminal, an RE terminal, an RESETB terminal, an RD terminal, and a TE terminal.

The word line driver 40 may include a word line selector and activate a write word line WWL used for a programming operation or a read word line RWL used for a read operation. For example, the word line driver 40 may select and activate a specific write word line WWL or read word line RWL based on a signal input through an ADD terminal.

The programming driver 50 may include a bit line selector and supply a program current to a common node of a column corresponding to a specific bit line based on a signal input through a WSEL terminal.

The eFuse cell array 60 may include a plurality of unit cells. The plurality of unit cells may be connected to a plurality of word lines and a plurality of bit lines. Each of the plurality of unit cells may perform a data write operation based on the program current provided from the programming driver 50. Among the plurality of unit cells constituting the eFuse cell array 60, unit cells connected to a same bit line and/or unit cells having a same common node may be referred to as a "column". Also, among the plurality of unit cells of the eFuse cell array 60, unit cells connected to a same word line may be unit cells connected to one row.

The bit line sense amplifier 70 may detect digital data output from a bit line connected to the eFuse cell array 60, and output the detected digital data through an output terminal DOUT.

In FIG. 1, a VDD terminal and a VSS terminal may be terminals for supplying externally supplied power and a ground voltage.

In one or more embodiments of the present disclosure to be described below, the shape or capacity of the eFuse cell array 60 is not particularly limited. However, in this disclosure, for convenience of description, a case in which the capacity of the eFuse cell array 60 is "128 rows×16 columns" will be described as an example. For example, the eFuse cell array 60 described in this disclosure may include 128 word lines and 16 bit lines. Accordingly, the eFuse cell array 60 may include a total of 2048 unit cells.

Figure 2:
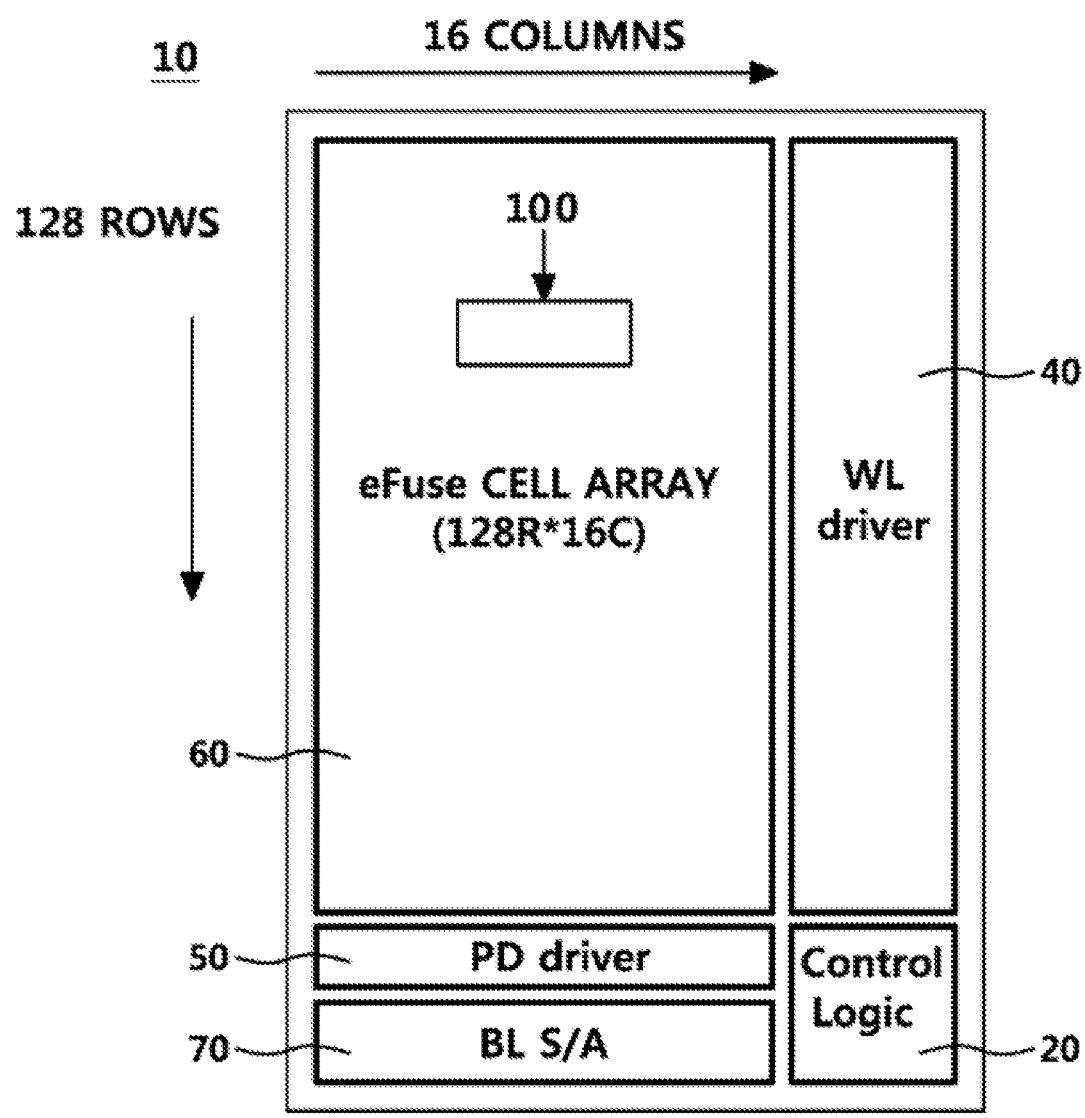
FIG. 2 illustrates an exemplary layout of a chip in which a non-volatile memory device having a fuse-type cell array is formed according to one or more embodiments of the present disclosure.

FIG. 2 illustrates an exemplary layout of a chip in which a non-volatile memory device having a fuse-type cell array is formed according to one or more embodiments of the present disclosure.

Referring to FIG. 2, the eFuse cell array 60 is disposed on a chip on which the non-volatile memory device 10 is formed, and the word line driver 40, the programming driver 50, the bit line sense amplifier 70, and the control logic 20 may be disposed around the eFuse cell array 60. For example, the word line driver 40 may be disposed on a right side of the eFuse cell array 60, and the programming driver 50 may be disposed on a lower side of the eFuse cell array 60. The bit line sense amplifier 70 may be disposed on a lower side of the programming driver 50, and the control logic 20 may be disposed at a right corner of the chip, which is corresponding to a lower side of the word line driver 40 and a right side of the programming driver 50.

According to one or more embodiments of this disclosure, by arranging each component of the non-volatile memory device 10 in the structure shown in FIG. 2, a size of the chip of the non-volatile memory device 10 may be reduced. However, the arrangement structure of each component of the non-volatile memory device 10 is not limited to the structure shown in FIG. 2.

As described above, the eFuse cell array 60 may include a plurality of unit cells 100. For example, when there are 128 word lines and 16 bit lines, the eFuse cell array 60 may include 2048 unit cells 100.

Figure 3:
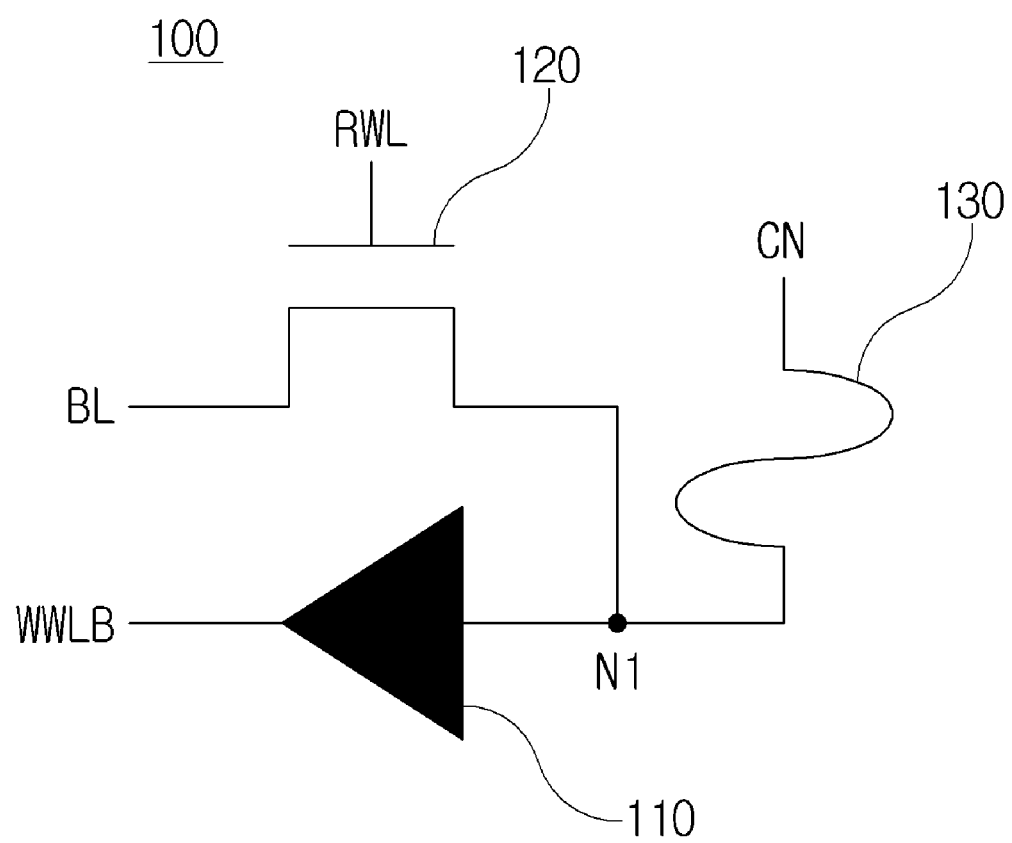
FIG. 3 illustrates an exemplary structure of a unit cell according to one or more embodiments of the present disclosure.

FIG. 3 illustrates an exemplary structure of a unit cell according to one or more embodiments of the present disclosure.

As illustrated in FIG. 3, a unit cell 100 may include a PN diode 110, a first n-type metal oxide semiconductor (NMOS) transistor 120, and a fuse 130.

The PN diode 110 may be connected between a write word line bar (WWLB) and a first node N1. The WWLB may be a line configured to receive an inversion signal WWLB of a write word line (WWL) signal indicating whether a write word line is activated. For example, an anode of the PN diode 110 may be connected to the fuse 130 through the first node N1, and a cathode of the PN diode 110 may be connected to the WWLB.

A gate of the first NMOS transistor 120 may be connected to an RWL, and both ends of the first NMOS transistor may be connected to a bit line BL and the first node N1. Both ends of the first NMOS transistor 120 mean a source terminal and a drain terminal. For example, the drain terminal of the first NMOS transistor 120 may be connected to the bit line BL, and the source terminal may be connected to the fuse 130 through the first node N1. The RWL may be a line configured to receive a read word line RWL signal indicating whether a read word line is activated.

The fuse 130 may be connected between the first node N1 and a common node CN. A common node CN exists for each column of the eFuse cell array 60, and unit cells disposed in each column may be connected to one common node CN. The fuse 130 may have a structure in which a silicide layer such as CoSi2 is formed on a poly-Si layer. The fuse 130 may receive a program current through the common node CN. Here, the common node CN may be referred to as a common line CL. The common line CL or the common node CN may be used at the time of the read operation as well as the program operation. It may be referred to as the "common node CN" or "common line CL", with meaning that it is commonly used for the program operation and the read operation.

According to one or more embodiments, in one unit cell, the PN diode 110 may be disposed on a lower side of the first NMOS transistor 120, and the fuse 130 may be disposed on a left or right side of the PN diode 110 and the first NMOS transistor 120. The arrangement positions of the PN diode 110, the first NMOS transistor 120, and the fuse 130 may vary depending on whether each unit cell is an even-numbered unit cell or an odd-numbered unit cell in the corresponding column. For example, in the case of an even-numbered unit cell, the fuse 130 may be disposed on the right side of the PN diode 110 and the first NMOS transistor 120, and in the case of an odd-numbered unit cell, the fuse 130 may be disposed on the left side of the PN diode 110 and the first NMOS transistor 120. The arrangement positions of the components (e.g., the PN diode 110, the first NMOS transistor 120, and the fuse 130) included in each unit cell will be described in more detail with reference to FIG. 4 as below.

Figure 4:
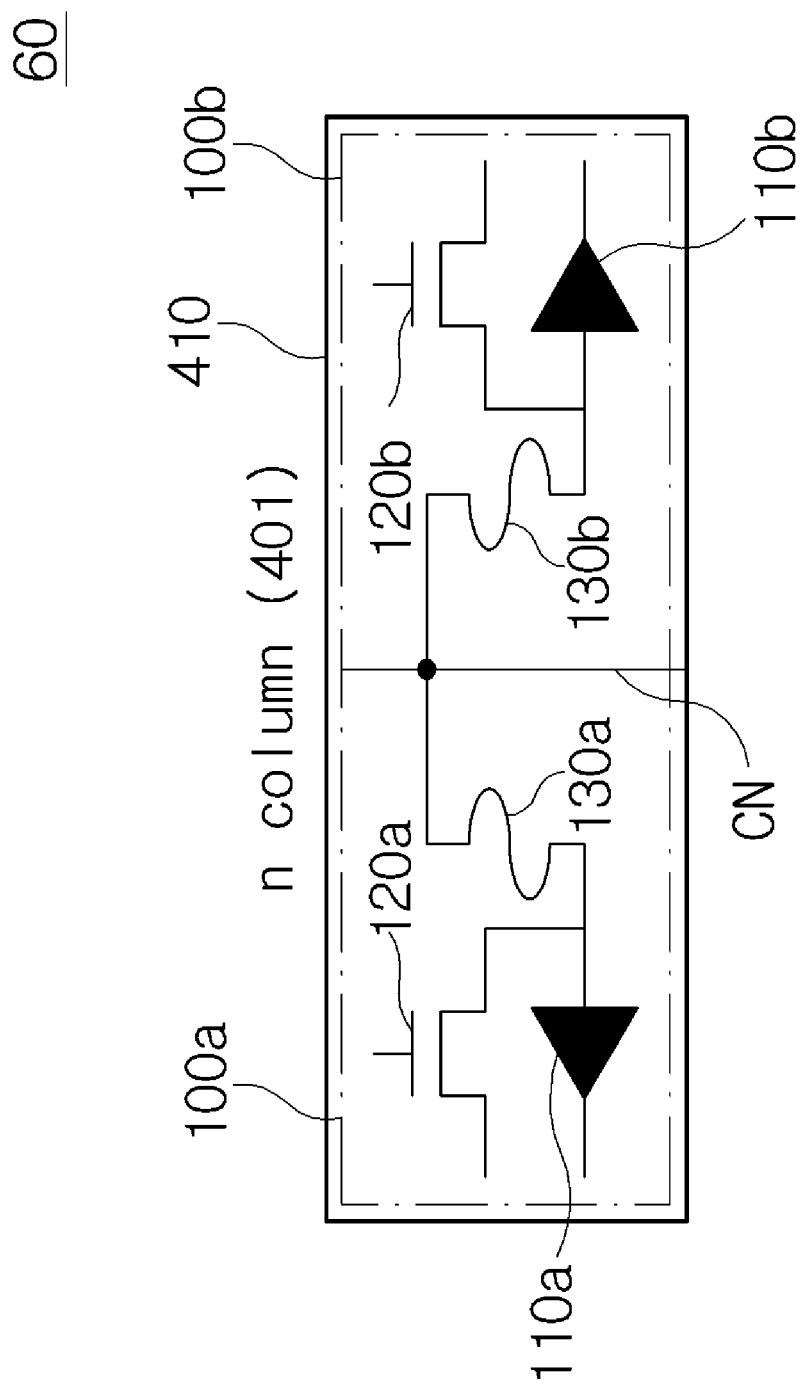
FIG. 4 illustrates an exemplary structure of a fuse-type cell array 60 including a pair of unit cells according to one or more embodiments of the present disclosure.

FIG. 4 illustrates an exemplary structure of a fuse-type cell array 60 including a pair of unit cells according to one or more embodiments of the present disclosure.

Referring to FIG. 4, the fuse-type cell array 60 includes at least one pair of unit cells. The at least one pair of unit cells may include a first unit cell 100a and a second unit cell 100b. The first unit cell 100a and the second unit cell 100b may be referred to as an even-numbered unit cell 100a and an odd-numbered unit cell 100b, respectively. Alternatively, the first unit cell 100a and the second unit cell 100b may be referred to as a first type unit cell 100a and a second type unit cell 100b, respectively.

The first unit cell 100a and the second unit cell 100b may have a structure symmetrical to each other with respect to a common node CN. For example, the first unit cell 100a may have a structure in which a fuse 130a is disposed on a right side of a PN diode 110a and a first NMOS transistor 120a. The second unit cell 100b may have a structure in which a fuse 130b is disposed on a left side of a PN diode 110b and a first NMOS transistor 120b. In addition, the first unit cell 100a and the second unit cell 100b may be disposed side by side in a horizontal direction based on the common node CN. For example, the first unit cell 100a located on the left side and the second unit cell 100b located on the right side with respect to the common node CN may be disposed side by side horizontally to form a bilaterally symmetrical structure. In an embodiment of the present disclosure, by configuring each unit cell of the fuse-type cell array 60 as described above, the area occupied by the fuse-type cell array 60 can be minimized. In addition, a p-type guard ring (P+ Guard ring, 410) surrounding the first and the second unit cells may be disposed. The p-type guard ring (P+ Guard ring, 410) refers to a highly doped p-type doped region.

In summary, a pair of unit cells may have a structure symmetrical to each other with respect to the common node CN. Here, the pair of unit cells may include one even-numbered unit cell and one odd-numbered unit cell. Therefore, based on the common node CN, the even-numbered unit cell and the odd-numbered unit cell may have a structure symmetrical to each other. Alternatively, the pair of unit cells may include one first type unit cell and one second type unit cell. Therefore, based on the common node CN, the first type unit cell and the second type unit cell may have a structure symmetrical to each other.

As set forth above, the common node CN may be referred to as a common line CL. The common line CL or the common node CN may be used at the time of the read operation as well as the program operation. It may be referred to as the "common node CN" or "common line CL", in the sense that it is commonly used for a program operation and a read operation.

Figure 5:
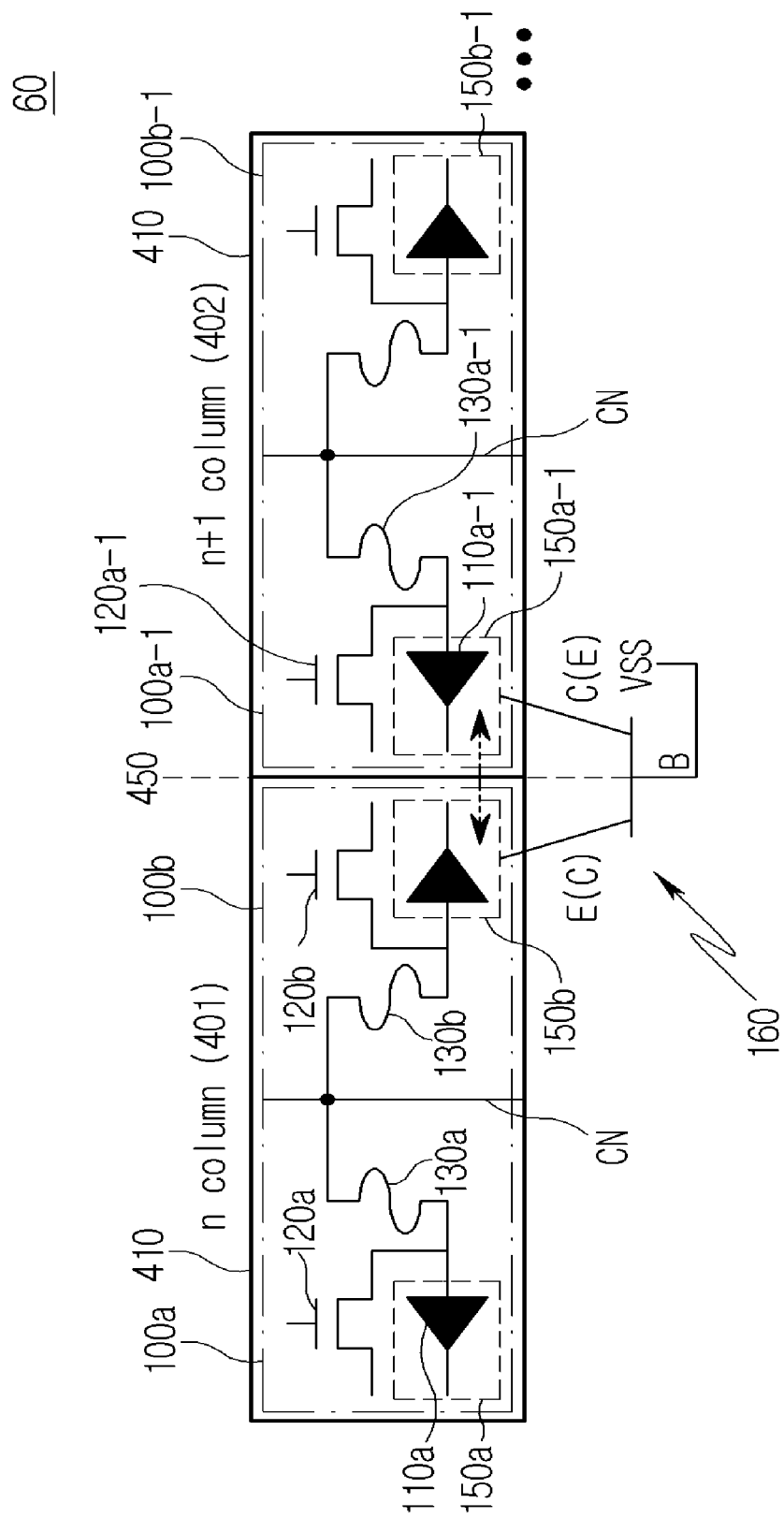
FIG. 5 illustrates an exemplary structure of the fuse-type cell array 60 including two pairs of unit cells according to one or more embodiments of the present disclosure.

FIG. 5 illustrates an exemplary structure of the fuse-type cell array 60 including two pairs of unit cells according to one or more embodiments of the present disclosure.

Referring to FIG. 5, the fuse-type cell array 60 may include two pairs of unit cells. Among the two pairs of unit cells, one pair may include the first unit cell 100a and the second unit cell 100b, and the other pair may include a third unit cell 100a-1 and a fourth unit cell 100b-1. For example, the one pair of unit cells including the first unit cell 100a and the second unit cell 100b may be disposed in an n column 401 of the fuse-type cell array 60. In addition, the other pair of unit cells including the third unit cell 100a-1 and the fourth unit cell 100b-1 may be disposed in an n+1 column 402 of the fuse-type cell array 60. Here, the first unit cell 100a and the fourth unit cell 100b-1 have a mirror shape with respect to each other. Similarly, the second unit cell 100b and the third unit cell 100a-1 also have a mirror shape with respect to each other. Therefore, the structure of the one pair of unit cells disposed in the n column 401 and the structure of the other pair of unit cells disposed in the n+1 column 402 have a structure symmetrical to each other with respect to a first imaginary line 450. The first imaginary line 450 is a line overlapping the p-type guard ring 410. Thus, it can be said that the structure of the one pair of unit cells disposed in the n column 401 and the structure of the other pair of unit cells disposed in the n+1 column 402 have a structure symmetrical to each other with respect the p-type guard ring 410.

The first to fourth PN diodes 110a, 110b, 110a-1, and 110b-1 are respectively formed in first to fourth n-type well (NW) regions 150a, 150b, 150a-1, and 150b-1 that are ion implanted with n-type dopant. The second NW 150b and the third NW 150a-1 are disposed adjacent to each other. Here, when the respective unit cells are configured as described above, a leakage current (dotted arrow) may be generated between adjacent columns. For example, when the n-type well (NW) regions 150b and 150a-1 in which the PN diode 110 is formed are disposed adjacent to each other, a parasitic bipolar junction transistor BJT 160 is formed between the adjacent PN diodes, thereby the leakage current may be generated. For example, the PN diode 110b in the first unit cell 100b of the n-th column 401 and the PN diode 110a-1 in the 0th unit cell 100a-1 of the n+1th column 402 are disposed adjacent to each other and form the parasitic BJT 160 between the two PN diodes 110b and 110a-1, and thus the leakage current (dotted arrow) may be generated. Since the leakage current (dotted arrow) generated between the PN diodes 110b and 110a-1 may damage a fuse electrically connected to the PN diodes, and thus it is very important to minimize the leakage current (dotted arrow) in order to prevent damage to the fuse.

Therefore, in one or more embodiments of the present disclosure, in order to prevent occurrence of the leakage current between adjacent columns, the p-type guard ring (P+ Guard ring, 410) may be disposed around an even-numbered unit cell and an odd-numbered unit cell having a structure symmetrical to each other. For example, one p-type guard ring 410 surrounding the 0th unit cell 100a and the first unit cell 100b of the n-th column 401 is disposed, and one p-type guard ring 410 surrounding the 0th unit cell 100a-1 and the first unit cell 100b-1 of the n+1-th column 401 may be disposed. For example, by disposing the p-type guard ring 410 between the PN diode 110b in the first unit cell 100b in the n-th column 401 and the PN diode 110a-1 in the 0th unit cell 100a-1 in the n+1-th column 402, it is possible to prevent forming of the parasitic BJT 160 between the two PN diodes 110b and 110a-1, thereby generating the leakage current (dotted arrow) can be prevented. In other words, in order to reduce the leakage current (dotted arrow) occurring between the two PN diodes 110b and 110a-1, the p-type guard ring (P+ Guard ring, 410) may be disposed between the second NW 150b and the third NW 150a-1. The doping concentration of the p-type guard ring (P+ Guard ring, 410) is higher than that of each of the second NW 150b and the third NW 150a-1.

Figure 6A:
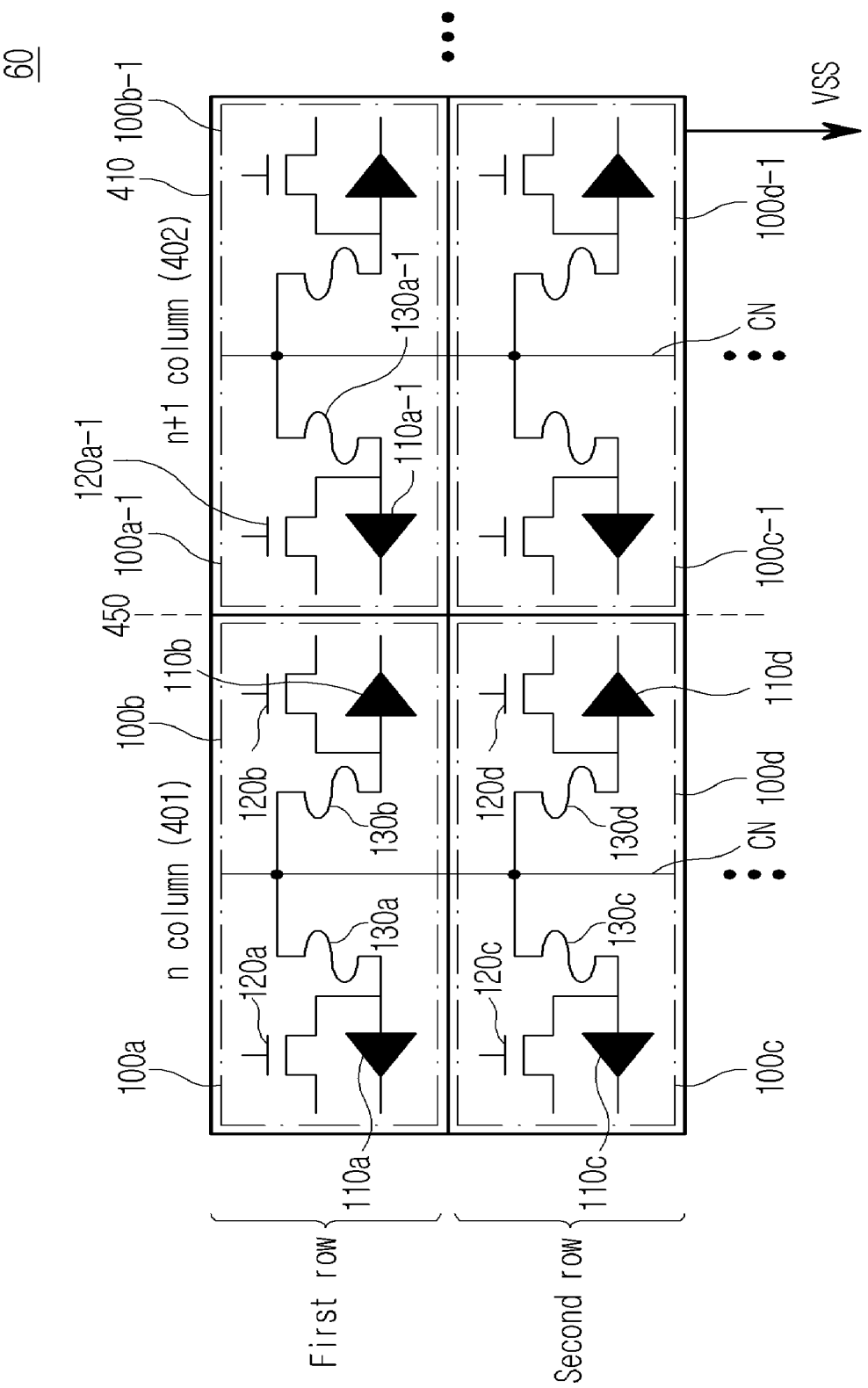
FIGS. 6A and 6B illustrate an exemplary structure of the fuse-type cell array 60 including four pairs of unit cells according to one or more embodiments of the present disclosure.

FIG. 6A illustrates an exemplary structure of the fuse-type cell array 60 including four pairs of unit cells according to one or more embodiments of the present disclosure.

Referring to FIG. 6A, the first row of the fuse-type cell array 60 includes at least four unit cells 100a, 100b, 100a-1, and 100b-1. Also, the second row of the fuse-type cell array 60 includes at least four unit cells 100c, 100d, 100c-1, and 100d-1.

The structure of one pair of unit cells in the fuse-type cell array 60 is the same as described with reference to FIG. 4. That is, one pair of unit cells may have a structure symmetrical to each other with respect to the common node CN. Here, the one pair of unit cells may include one even-numbered unit cell and one odd-numbered unit cell. Therefore, based on the common node CN, the even-numbered unit cell and the odd-numbered unit cell may have a structure symmetrical to each other. Alternatively, the one pair of unit cells may include one first type unit cell and one second type unit cell. Therefore, based on the common node CN, the first type unit cell and the second type unit cell may have a structure symmetrical to each other.

For example, even-numbered unit cells 100a and 100c (or first type unit cells) and odd-numbered unit cells 100b and 100d (or second type unit cells) of column 401 may have a structure symmetrical to each other with respect to the common node CN. For example, the 0th unit cell 100a may have a structure in which the fuse 130a is disposed on the right side of the PN diode 110a and the first NMOS transistor 120a, and the first unit cell 100b may have a structure in which the fuse 130b is disposed on the left side of the PN diode 110b and the first NMOS transistor 120b. Also, the even-numbered unit cells 100a and 100c and the odd-numbered unit cells 100b and 100d may be disposed side by side horizontally with respect to the common node CN. For example, the 0th unit cell 100a located on the left side and the first unit cell 100b located on the right side with respect to the common node CN may be disposed side by side horizontally to form a bilaterally symmetrical structure. In an embodiment of the present disclosure, by configuring each unit cell of the fuse-type cell array 60 as described above, the area occupied by the fuse-type cell array 60 can be minimized.

Referring again to 6A, the structure of each of the unit cells 100*a*, 100*b*, 100*a*-1, and 100*b*-1 in the first row in the fuse-type cell array 60 is the same as those described with reference to FIG. 5 as above. That is, it can be said that the structure of the one pair of unit cells 100*a* and 100*b* disposed in the n column 401 and the structure of the other pair of unit cells 100*a*-1 and 100*b*-1 disposed in the n+1 column 402 have a structure symmetrical to each other with respect to the p-type guard ring 410.

In addition, based on the imaginary line 450, the structure of the unit cells 100*a*, 100*b*, 100*c*, 100*d* disposed in the n column 401 may be symmetrical (mirror shape) to the structure of the unit cells 100*a*-1, 100*b*-1, 100*c*-1, 100*d*-1 disposed in the n+1 column 402. Here, the imaginary line 450 is a line overlapping the p-type guard ring 410. In other words, based on the p-type guard ring 410, the structure of the unit cells 100*a*, 100*b*, 100*c*, 100*d* disposed in the n column 401 may be symmetrical (mirror shape) to the structure of the unit cells 100*a*-1, 100*b*-1, 100*c*-1, 100*d*-1 disposed in the n+1 column 402.

Referring still to FIG. 6A, the unit cells 100*c*, 100*d*, 100*c*-1, and 100*d*-1 in the second row have a structure in that they are repeated in the same shape identical to the unit cells 100*a*, 100*b*, 100*a*-1, 100*b*-1 in the first row. In addition, the positions of the PN diodes are as far away as possible from each other. The PN diodes disposed in the first row and the PN diodes in the second row are disposed as far away as possible. The p-type guard ring 410 structure is formed to reduce the leakage current between the unit cells 100*a*, 100*b*, 100*a*-1, 100*b*-1 in the first row and the unit cells 100*c*, 100*d*, 100*c*-1, 100*d*-1 in the second row.

Figure 6B:
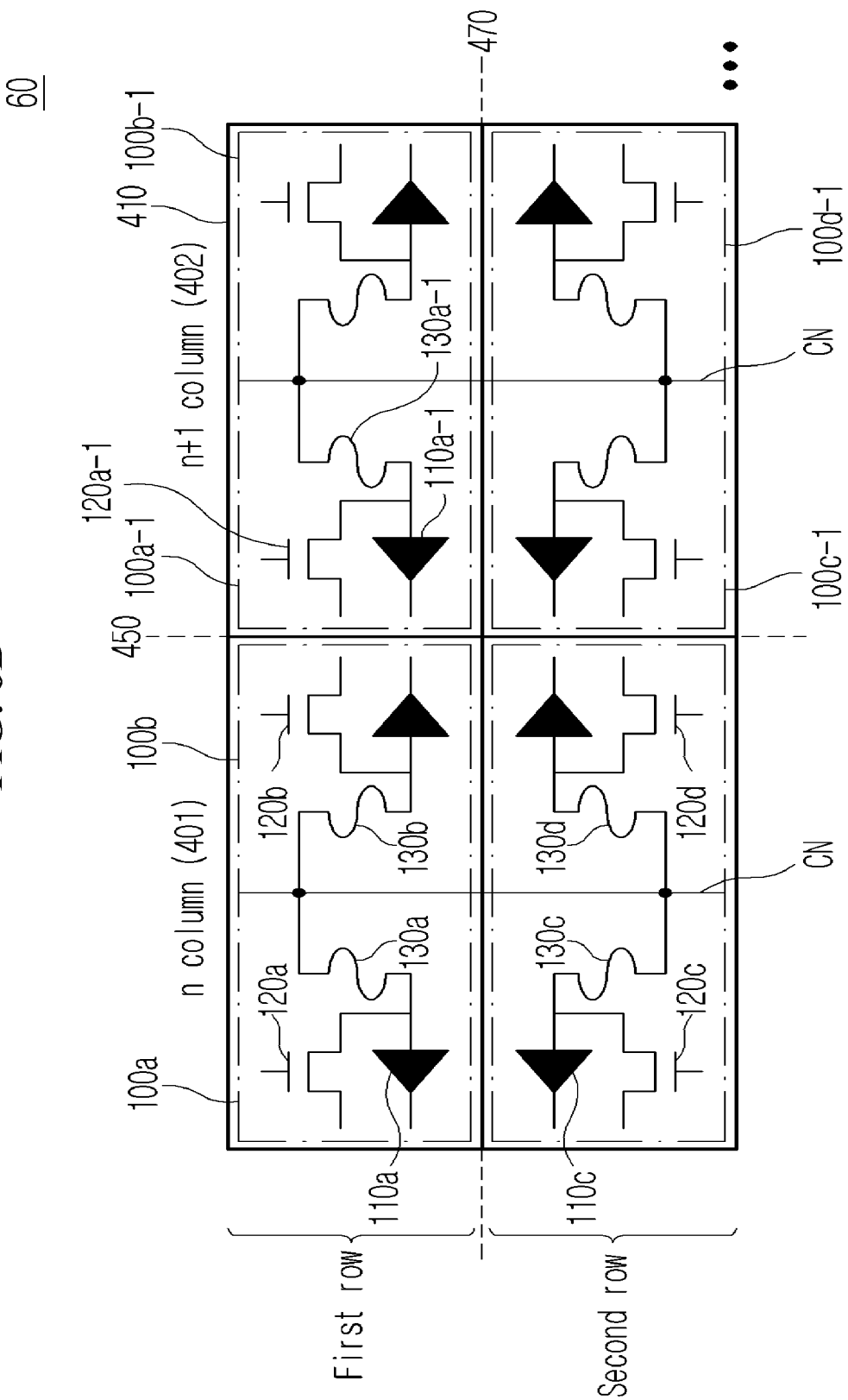

FIG. 6B illustrates an exemplary structure of the fuse-type cell array 60 including four pairs of unit cells according to one or more embodiments of the present disclosure.

Referring to FIG. 6B, the structure of the unit cells 100*a*, 100*b*, 100*a*-1, and 100*b*-1 in the first row of the fuse-type cell array 60 are the same as described with reference to FIG. 5. However, the unit cells 100*c* and 100*d* in the n column 401 and the second row have a mirror shape of the unit cells 100*a* and 100*b* in the first row with respect to a second imaginary line 470. Similarly, the unit cells 100*c*-1 and 100*d*-1 in the n+1 column 402 and the second row also have a mirror shape of the unit cells 100*a*-1 and 100*b*-1 with respect to the second imaginary line 470 in the first row. Therefore, the four PN diodes 110*b*, 110*a*-1, 110*d*, and 110*c*-1 are disposed close to each other in a central portion where the first imaginary line 450 and the second imaginary line 470 intersect. Even when the four PN diodes 110*b*, 110*a*-1, 110*d*, and 110*c*-1 are disposed close to each other, a high concentration of the p-type guard ring 410 is disposed between the PN diodes 110*b*, 110*a*-1, 110*d*, and 110*c*-1, and thus the leakage current can be prevented.

According to the embodiments of the present disclosure, by configuring the eFuse cell array as shown in FIGS. 4, 5, 6A and 6B, it is possible to prevent the leakage current while minimizing the area of the eFuse cell array.

Figure 7:
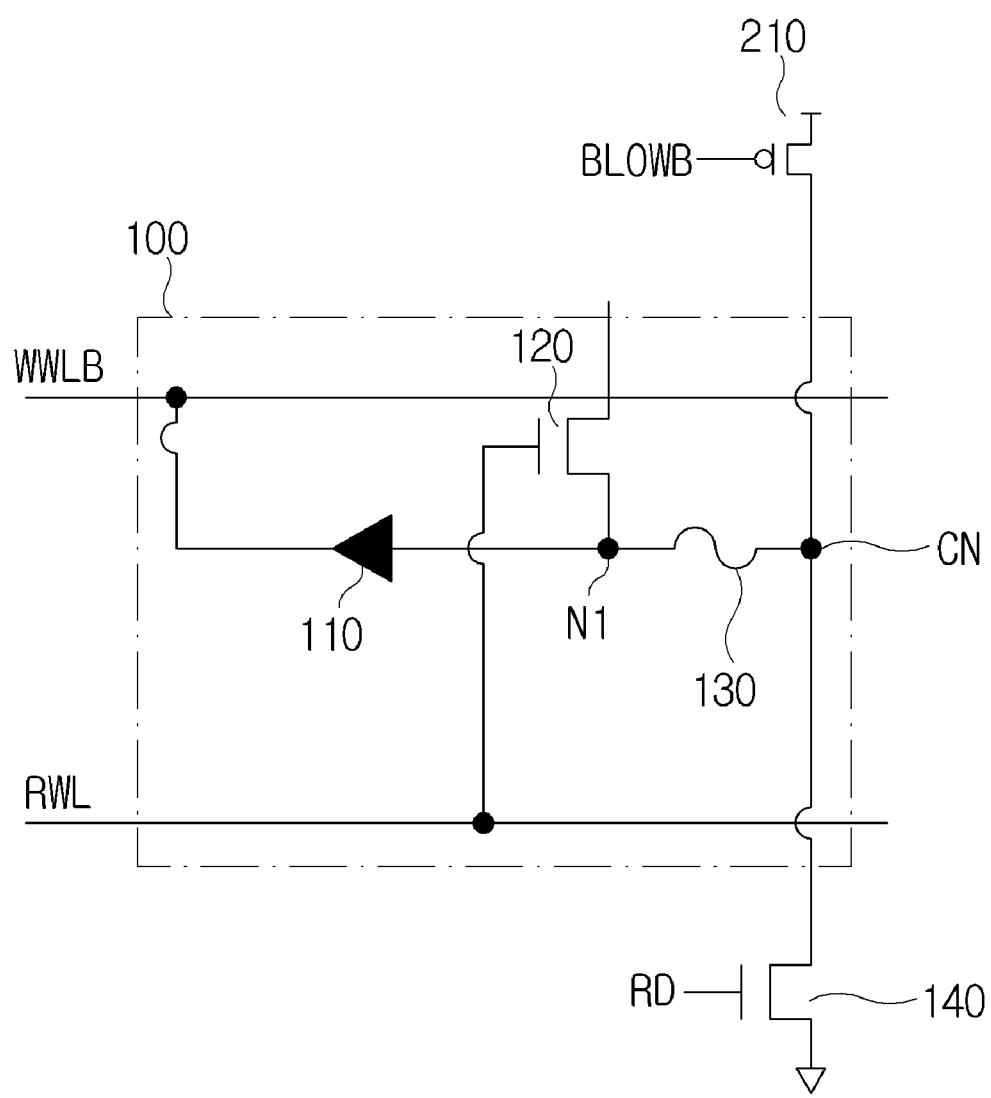
FIG. 7 illustrates an exemplary connection structure of a unit cell in a non-volatile memory device having a fuse-type cell array according to one or more embodiments of the present disclosure.

FIG. 7 illustrates an exemplary connection structure of a unit cell in a non-volatile memory device having a fuse-type cell array according to one or more embodiments of the present disclosure.

Referring to FIG. 7, the unit cell 100 may include the PN diode 110, the first NMOS transistor (or a first switching element) 120, and the fuse 130. Since the connection structure of the diode 110, the first NMOS transistor 120, and the fuse 130 in the unit cell 100 is the same as that described in FIG. 3, a description thereof will be omitted.

According to one or more embodiments, the fuse 130 of the unit cell 100 may be connected to a second NMOS transistor (or a second switching element) 140 and a first PMOS transistor (or a third switching element) 210 disposed outside the unit cell through the common node CN. Here, the second and third switching elements 140 and 210 may be disposed outside the unit cell 100. This is because the second and third switching elements 140 and 210 are commonly connected to the plurality of unit cells included in the same column. For example, the second NMOS transistor 140 and the first PMOS transistor 210 may be connected to the plurality of unit cells included in the n-th column through the common node CN.

As described above, by disposing the second and third switching elements 140 and 210 outside the unit cell 100, the size of each unit cell 100 can be minimized, and accordingly the size of the entire eFuse cell array 60 including the plurality of unit cells can be reduced. That is, by reducing the size of the eFuse cell array 60, which occupies the largest area of the chip of the non-volatile memory device 10, the size of the chip can be effectively reduced.

A gate terminal of the second NMOS transistor 140 may be connected to an RD, and both ends of the second NMOS transistor 140 may be connected to the common node CN and ground. For example, the second NMOS transistor 140 may be connected to fuses of the plurality of unit cells through the common node CN.

A gate terminal of the first PMOS transistor 210 may be connected to a BLOWB line, and both ends of the first PMOS transistor 210 may be connected to the power supply voltage and the common node CN. For example, the first PMOS transistor 210 may be connected to the fuses of the plurality of unit cells through the common node CN. The BLOWB line may be a line to which an inversion signal of a signal indicating whether the fuse is blown is provided.

Figure 8:
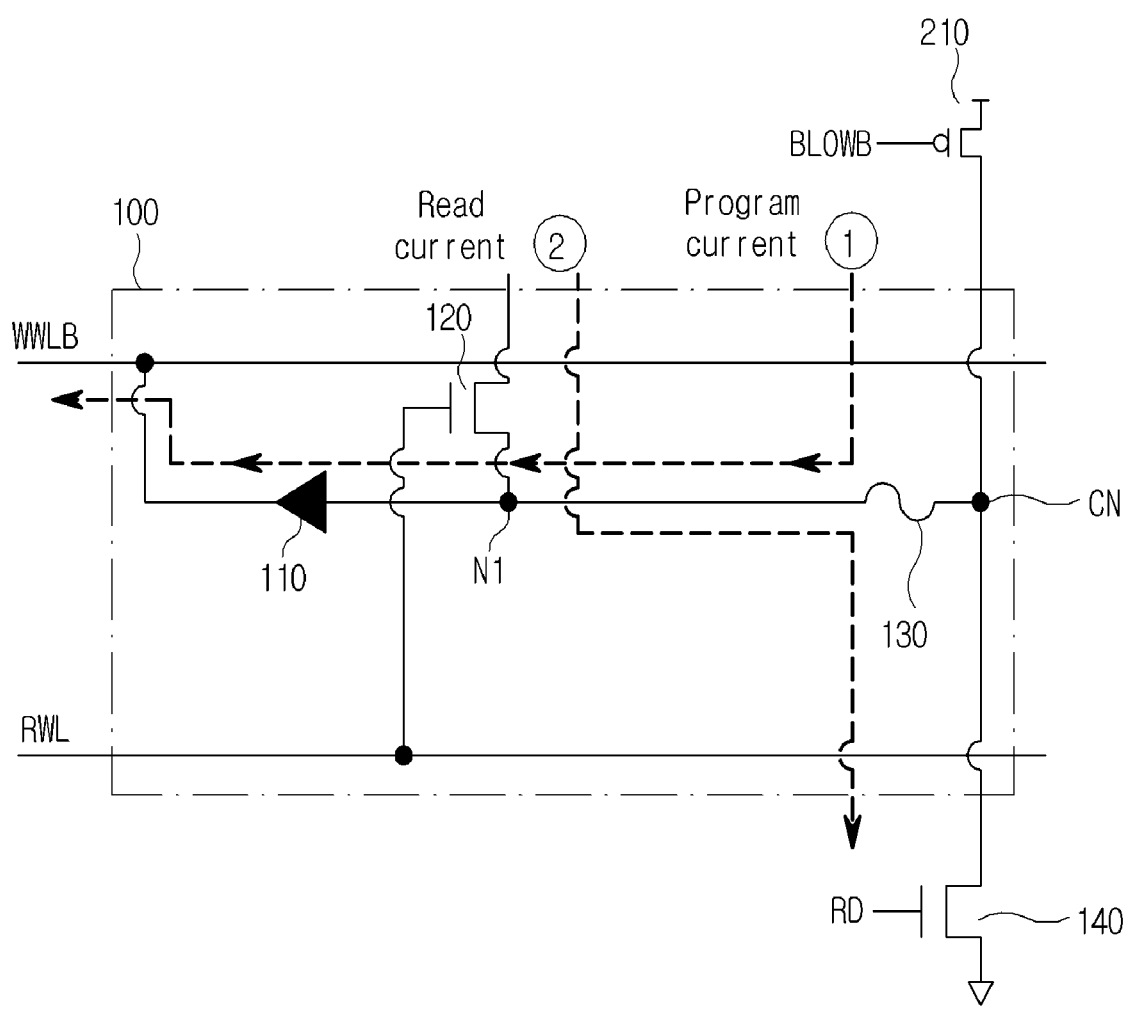
FIG. 8 illustrates exemplary flows of a read current and a write current of a unit cell according to one or more embodiments of the present disclosure.

FIG. 8 illustrates exemplary flows of a read current and a write current of a unit cell according to one or more embodiments of the present disclosure.

Referring to FIG. 8, a dotted arrow ① indicates a current flow path for the unit cell 100 during the program operation.

According to one or more embodiments, the first PMOS transistor 210 may be turned off when a signal of a high level is provided through the BLOWB line. Here, the BLOWB of a high level may indicate that a fuse blowing is not required.

According to one or more embodiments, when a signal of a low level is provided through the BLOWB line, the first PMOS transistor 210 may be turned on to provide the program current according to the program voltage to the common node CN. Here, the BLOWB of a low level may indicate that the fuse blowing is required for programming of data '1'. The program current is transferred to the fuse 130 through the common node CN, and the fuse 130 may be programmed or blown by the program current. Programming or blowing refers to raising a resistance of the fuse. The program current may flow in a direction from the anode to the cathode of the fuse 130 and may exit to the WWLB through the PN diode 110. Here, the WWLB should be selected in advance.

Referring to FIG. 8, a dotted arrow ② indicates a current flow path for the unit cell 100 during the read operation.

According to one or more embodiments, the first NMOS transistor 120 may be turned off when a signal of a low level is provided to the gate through the RWL line, and may be turned on when a signal of a high level is provided to the gate through the RWL line. Here, the RWL signal of a low level may indicate that the corresponding read word line is not selected, and the RWL signal of a high level may indicate that the corresponding read word line is selected.

According to one or more embodiments, the second NMOS transistor 140 may be turned off when a signal of a low level is provided to the gate through the RD line, and may be turned on when a signal of a high level is provided to the gate through the RD line. Here, the RD of a high level may indicate a read mode, and the RD of a low level may indicate that a not-read mode.

According to one or more embodiments, when both the first NMOS transistor 120 and the second NMOS transistor 140 are turned on, the first NMOS transistor 120 may apply a read current to the fuse 130 according to a read voltage provided from a bit line BL. The read current may pass through the fuse 130, and a value of the read current may vary according to a resistance of the fuse 130. For example, a value of the read current when the fuse 130 is blown may be less than a value of the read current when the fuse 130 is not blown. The read current passing through the fuse 130 may flow to the second NMOS transistor 140 through the common node CN. Here, the read current flows in a direction from the cathode to the anode of the fuse 130, it can be said that the read current flows in the opposite direction to the program current. In addition, since the read current does not pass through the PN diode 110, a high drive voltage does not need to be used for the read operation. Therefore, the read current may use a low drive current. The value of the read current may be used to check whether the fuse 130 is programmed.

The non-volatile memory device 10 having a fuse-type cell array according to various embodiments of the present disclosure may program data '1' in the first unit cell by blowing the fuse by applying a high voltage to the first unit cell, may program data '0' in the first unit cell by not applying a high voltage to the first unit cell and maintaining the fuse in an un-blown state. When data '1' is programmed in the first unit cell in the non-volatile memory device 10, a voltage may be charged in the common node CN by a high voltage applied to the first unit cell. Since the plurality of unit cells are connected to the common node CN, a voltage charged in the common node CN when the first unit cell is programmed may damage fuses of the other unit cells. For example, in a situation where data '0' needs to be programmed in the second unit cell, the fuse of the second unit cell is blown by the voltage charged in the common node and thus there may happen a situation as if data '1' were programmed in the second unit cell.

Accordingly, one or more embodiments of the present disclosure disclose a circuit structure for discharging the voltage charged in the common node by the program operation.

Figure 9:
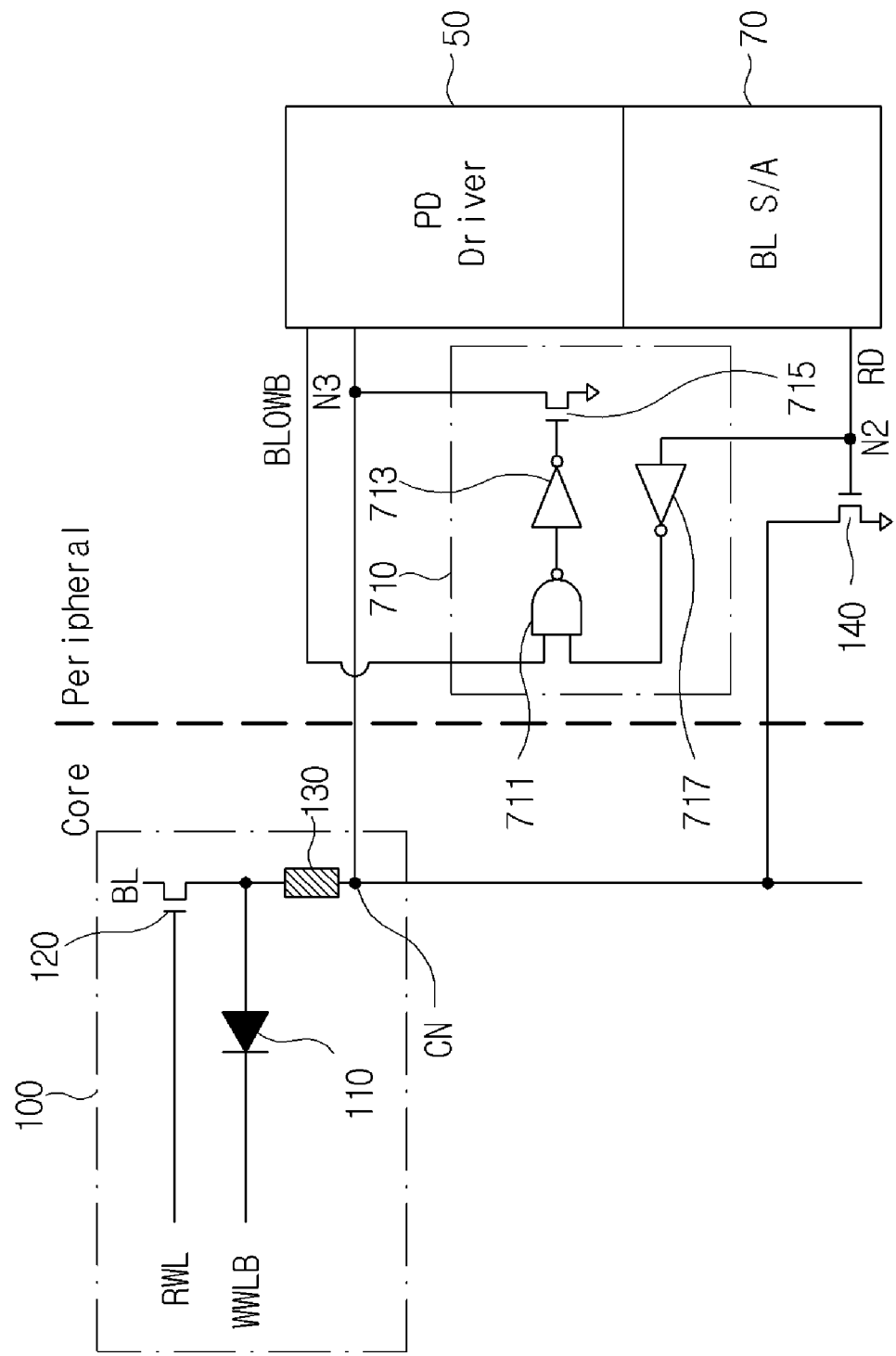
FIG. 9 illustrates an exemplary discharge circuit for a common node in a non-volatile memory device having a fuse-type cell array according to one or more embodiments of the present disclosure.

FIG. 9 illustrates an exemplary discharge circuit for a common node in a non-volatile memory device having a fuse-type cell array according to one or more embodiments of the present disclosure.

Referring to FIG. 9, the non-volatile memory device 10 may further include a common node discharge circuit 710. According to one or more embodiments, the non-volatile memory device 10 may further include the common node discharge circuit 710 connected to each column in addition to the components described with reference to FIGS. 1 to 8 (e.g., the control logic 20, the word line driver 40, the programming driver 50, the eFuse cell array 60, and the bit line sense amplifier 70).

According to one or more embodiments, the common node discharge circuit 710 may be disposed in a peripheral area of the unit cell 100. For example, the common node discharge circuit 710 may be disposed outside the unit cell 100, as like the second NMOS transistor 140 and the first PMOS transistor 210. This is because the common node discharge circuit 710 is connected to the plurality of unit cells through the common node CN. That is, although only one unit cell 100 is illustrated in FIG. 9 for convenience of illustration, the common node discharge circuit 710 may be commonly connected to the plurality of unit cells included in the n-th column through one common node CN. Accordingly, in the embodiments of the present disclosure, the sizes of the unit cell 100 and the eFuse cell array 60 can be minimized by disposing the common node discharge circuit 710 in the peripheral area of the unit cell 100.

The common node discharge circuit 710 is a circuit configured to prevent damage of the fuses of the unit cells connected to the common node by the voltage charged in the common node, and thus may discharge the voltage charged in the common node according to an RD signal and a BLOWB signal.

The common node discharge circuit 710 may include a first inverter (or a first NOT gate, 717), a first NAND gate 711, a second inverter (or a second NOT gate, 713), and a third NMOS transistor 715.

The first inverter 717 may be connected to a second node N2 between the second NMOS transistor 140 and the bit line sense amplifier 70 and the first NAND gate 711. The first inverter 717 may invert the RD signal provided from the bit line sense amplifier 70 and output the inversion signal to the first NAND gate 711. The RD signal may be a signal indicating whether the read mode is present. For example, the RD signal of a high level may indicate a read mode, and the RD signal of a low level may indicate a not-read mode.

Input terminals of the first NAND gate 711 may be connected to the BLOWB line of the programming driver 50 and the first inverter 717, and an output terminal of the first NAND gate 711 may be connected to the second inverter 713. The first NAND gate 711 may perform a NAND operation on the BLOWB signal provided from the programming driver 50 and the signal provided from the first inverter 717, and output the result. The BLOWB signal may mean an inversion signal of a signal indicating whether the fuse is blown. For example, the BLOWB signal of a low level may indicate that the fuse blowing is required, and the BLOWB signal of a high level may indicate that the fuse blowing is not required.

The second inverter 713 may be connected to an output terminal of the first NAND gate 711 and a gate of the third NMOS transistor 715. The second inverter 713 may invert a signal provided from the first NAND gate 711 and provide the inverted signal to the gate of the third NMOS transistor 715.

The third NMOS transistor 715 may be connected to a third node N3 between the common node CN and the programming driver 50 and ground. The third NMOS transistor 715 may be turned on and discharge the voltage charged in the common node CN through the third node N3, when a signal of a high level is input to the gate of the third NMOS transistor 715.

The configuration of the unit cell 100 and the connection structure with the other components are the same as those described with reference to FIGS. 3 to 7, and the operation of the unit cell 100 is the same as described with reference to FIG. 8. Accordingly, a description of the configuration, connection structure, and operation of the unit cell 100 will be omitted.

The programming driver 50 may generate the program voltage according to a control signal of the control logic 20 and select a specific column of the eFuse cell array 60. The programming driver 50 may provide the generated program voltage to the common node CN of the selected column. According to an embodiment, the programming driver 50 may include the first PMOS transistor 210 as shown in FIG. 7. For example, the programming driver 50 may include a plurality of first PMOS transistors connected to the common node CN of each column of the eFuse cell array 60.

According to one or more embodiments, the programming driver 50 may provide the BLOWB signal to the first NAND gate 711 of the common node discharge circuit 710 according to the control signal of the control logic 20. The BLOWB signal may be output at a low level only when the fuse blowing is required for a specific unit cell 100, and may be output at a high level otherwise. For example, in a mode for programming data '1' in the specific unit cell 100, since the fuse blowing is required, the programming driver 50 may output the BLOWB signal of a low level according to the control of the control logic 20. As another example, in the case of a mode for programming data '0' in the specific unit cell 100, since the fuse blowing is not required, the programming driver 50 may output the BLOWB signal of a high level according to the control of the control logic 20. As another example, in a read mode for reading data of the specific unit cell 100 or in a standby mode, the fuse blowing is not required, and thus the programming driver 50 may output the BLOWB signal of a high level according to the control of the control logic 20.

According to one or more embodiments, the bit line sense amplifier 70 may provide the RD signal to the first inverter 717 of the common node discharge circuit 710 and the gate of the second NMOS transistor 140 according to the control signal of the control logic 20. The RD signal may be output at a high level only in a read mode for reading data of the specific unit cell 100, and may be output at a low level otherwise. For example, in a read mode for reading data of the specific unit cell 100, the bit line sense amplifier 70 may transmit the RD signal of a high level to the first inverter 717 and the gate of the second NMOS transistor 140. As another example, in the case of the mode for programming data '1' in the specific unit cell 100, the mode for programming data '0' in the specific unit cell 100, or the standby mode, the bit line sense amplifier 70 may provide the RD signal of a low level to the first inverter 717 and the gate of the second NMOS transistor 140.

According to the structure as described above, when the common node discharge circuit 710 receives the BLOWB signal of a high level from the programming driver 50 and the RD signal of a low level from the bit line sense amplifier 70, it may discharge the voltage charged in the common node CN by turning on the third NMOS transistor 715. For example, as shown in Table 1 below, the common node discharge circuit 710 may operate to discharge the voltage charged in the common node CN when an operation mode (OP mode) of the non-volatile memory device is in a '0' program mode for programming data '0' or the standby mode.

Table 1 below is a truth table of signals according to the operation mode (OP mode) of the non-volatile memory device 10.

TABLE 1

| WWLB | RWL | RD | BLOWB | OP mode |
|------|-----|----|----|---------|
| L | L | L | L | programming '1' |
| L | L | L | H | programing '0' |
| H | H | H | H | reading |
| H | L | L | H | Waiting |

Table 1 shows the levels of the WWLB, RWL, RD, and BLOWB signals for each operation mode of the non-volatile memory device 10. For example, when the operation mode of the non-volatile memory device 10 is the '1' program mode, all of the WWLB, RWL, RD, and BLOWB signals may be of a low level. When the operation mode of the non-volatile memory device 10 is the '0' program mode, the WWLB, RWL, and RD signals may be of a low level, and the BLOWB signal may be of a high level. When the operation mode of the non-volatile memory device 10 is the read mode, all of the WWLB, RWL, RD, and BLOWB signals may be of a high level. When the operation mode of the non-volatile memory device 10 is the standby mode, the WWLB and BLOWB signals may be of a high level, and the RWL and RD signals may be of a low level.

When the operation mode of the non-volatile memory device 10 is the '0' program mode or the standby mode, the common node discharge circuit 710 may receive the BLOWB signal of a high level and the RD signal of a low level as shown in Table 1 above, thereby turning on the third NMOS transistor. The common node discharge circuit 710 may discharge the voltage charged in the common node CN through the turned-on third NMOS transistor.

When the operation mode of the non-volatile memory device 10 is the '1' program mode, the common node discharge circuit 710 receives the BLOWB signal of a low level as shown in Table 1 above, thereby maintaining the third NMOS transistor 715 in an OFF state. In addition, when the operation mode of the non-volatile memory device 10 is the read mode, the common node discharge circuit 710 may receive the RD signal of a high level as shown in Table 1 above, and thus maintain the third NMOS transistor 715 in an OFF state.

The non-volatile memory device 10 according to various embodiments of the present disclosure may include the common node discharge circuit 710 as shown in FIG. 9 and generate an internal control signal as shown in Table 1. Accordingly, the non-volatile memory device 10 according to various embodiments of the present disclosure may discharge, at the time of the standby mode or the '0' program mode, the voltage charged in the common node CN during the '1' program mode, thereby preventing damage of the fuses of the other unit cells connected to the node CN.

Figure 10:
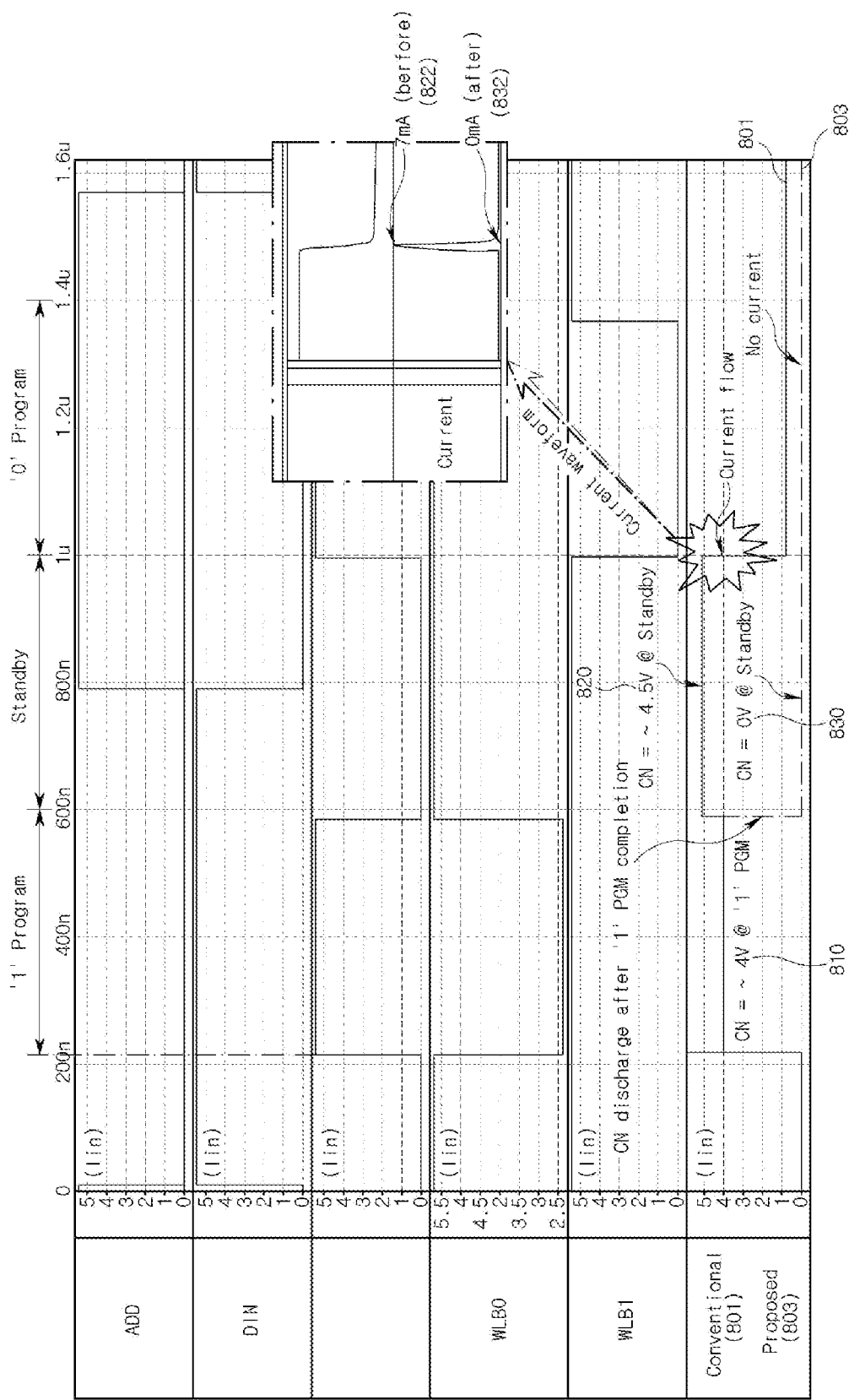
FIG. 10 illustrates a result of measuring a current of a common node during a program operation in a non-volatile memory device having a fuse-type cell array according to one or more embodiments of the present disclosure.

FIG. 10 illustrates a result of measuring a current of a common node during a program operation in a non-volatile memory device having a fuse-type cell array according to one or more embodiments of the present disclosure. In FIG. 10, a "conventional" (801) is a result of measuring the voltage/current of the common node in the non-volatile memory device that does not include the common node discharge circuit, and a "proposed" (803) is a result of measuring the voltage/current of the common node in the non-volatile memory device that includes the common node discharge circuit.

In an embodiment illustrated in FIG. 10, the operation mode of the non-volatile memory device 10 may be sequentially changed to the '1' program mode, the standby mode, and the '0' program mode. When the operation mode of the non-volatile memory device 10 is the '1' program mode, both the "conventional" (801) and the "proposed" (803) may be operated with a voltage of about 4V (810) charged in the common node CN.

However, when the operation mode of the non-volatile memory device 10 is changed from the '1' program mode to the standby mode, it can be seen that the common node CN of the "conventional" (801) is charged with a voltage of about 4.5V (820), however, for the "proposed" (803), the voltage charged in the common node CN is discharged and a voltage of about 0V (830) is measured.

In addition, when the operation mode of the non-volatile memory device 10 is changed from the standby mode to the '0' program mode, it can be seen that a high current of about 7 mA (822) is generated instantaneously by the voltage charged and maintained in the common node (CN) of the "conventional" (801). In this case, the fuse of the unit cell to be programmed as '0' by the '0' program mode is blown, and thus there may happen a situation as if data '1' were programmed therein.

On the other hand, in the case of the "proposed" (803), since the voltage charged in the common node CN was all discharged during the standby mode and thus a voltage of about 0V is maintained, even when a signal according to the '0' program mode is input, the current of 0 mA (832) is measured at the common node CN. Accordingly, the fuse of the unit cell to be programmed as '0' by the '0' program mode is maintained in an un-blown state, so that data '0' may be normally programmed.

Figure 11:
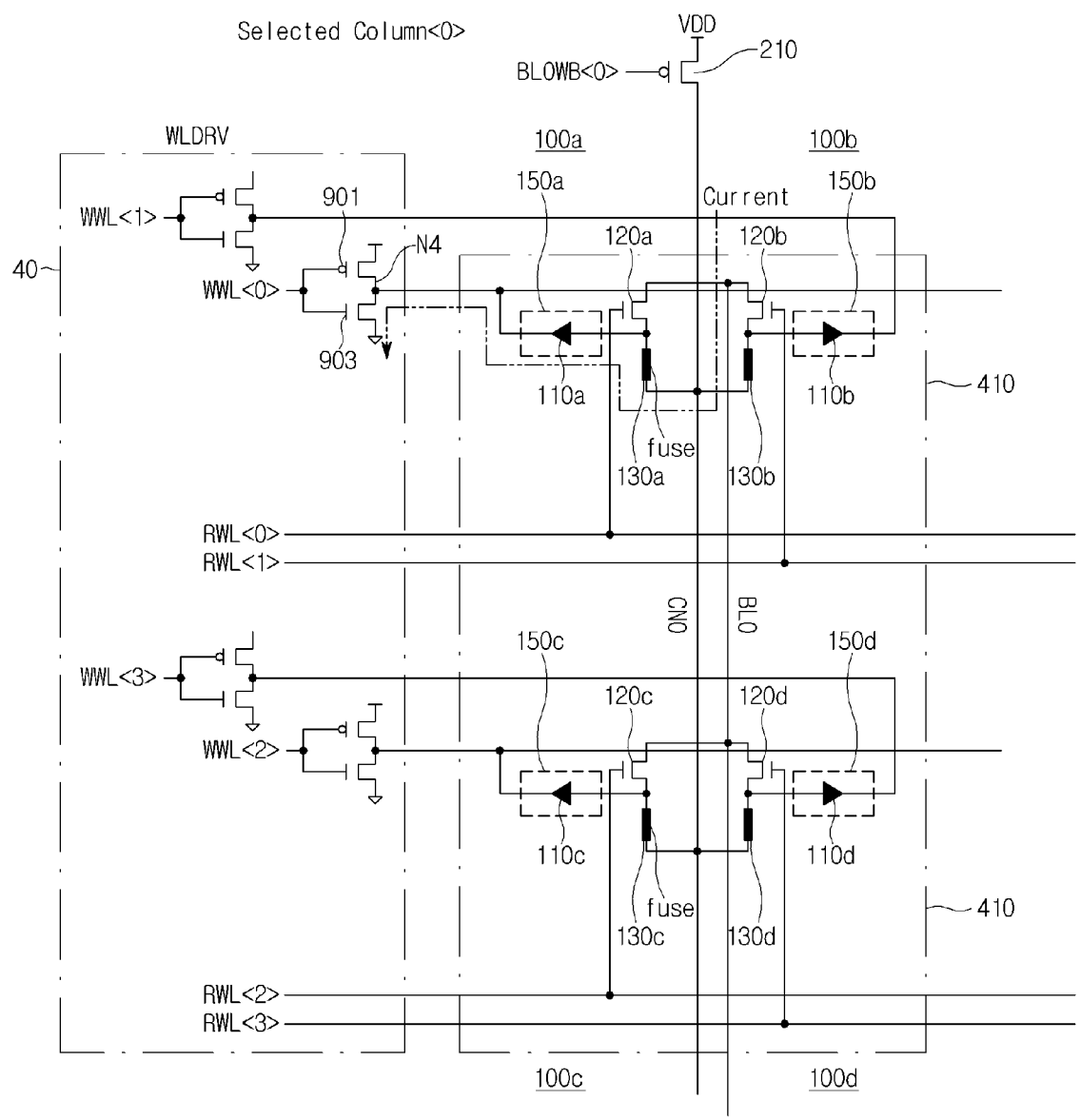
FIG. 11 illustrates an exemplary circuit configuration diagram illustrating a write operation of a non-volatile memory device having a fuse-type cell array according to one or more embodiments of the present disclosure.

FIG. 11 illustrates an exemplary circuit configuration diagram of illustrating a write operation of a non-volatile memory device having a fuse-type cell array according to one or more embodiments of the present disclosure.

FIG. 11 illustrates a current flow when data '1' is programmed into the 0th unit cell 100a in the 0th column (column<0>) among the plurality of unit cells included in the eFuse cell array 60.

Referring to FIG. 11, the word line driver 40 may include a second PMOS transistor 901 and a fourth NMOS transistor 903 for each write word line. A gate of the second PMOS transistor 901 may be connected to the WWL line, and both ends of the second PMOS transistor 901 may be connected to VDD and the fourth node N4. A gate of the fourth NMOS transistor 903 may be connected to the WWL line, and both ends of the fourth NMOS transistor 903 may be connected to the fourth node N4 and ground. Here, the fourth node N4 may be connected to the PN diode 110a of the unit cell 100a.

The first NMOS transistors 120a, 120b, 120c, and 120d receive the read voltage from a bit line BL0. Therefore, they may apply a read current to the fuses 130a, 130b, 130c, and 130d. The configuration, connection structure, and operation of each of the unit cells 100a, 100b, 100c, and 100d are the same as described with reference to FIGS. 3 to Therefore, in FIG. 11, a detailed description of the components inside the unit cell 100a will be omitted.

Referring to FIG. 11, as described above, the memory device 10 includes an eFuse cell array 60 in which different types of unit cells, for example, the first type unit cells 100a and 100c and the second type unit cells 100b and 100d are alternately disposed. The different types of unit cells 100a, 100b, 100c, and 100d respectively include PN diodes 110a, 110b, 110c and 110d; first NMOS transistors 120a, 120b, 120c and 120d; and fuses 130a, 130b, 130c and 130d. Here, the PN diodes 110a, 110b, 110c, and 110d may be formed surrounded by n-type well regions 150a, 150b, 150c, and 150d, respectively.

The first type unit cells 100a and 100c and the second type unit cells 100b and 100d are connected to each other through a common node CN0. The first type unit cell 100a and the second type unit cell 100b in the first row are disposed to have a structure bilaterally symmetrical to each other with respect to the common node CN0. Similarly, the first type unit cell 100c and the second type unit cell 100d in the second row are disposed to have a structure bilaterally symmetrical with respect to the common node CN0. The first-type unit cells 100a and 100c and the second-type unit cells 100b and 100d, which are disposed to have a structure bilaterally symmetrical to each other, are connected to a same bit line BL0. A pair of unit cells 100a and 100b is surrounded by the p-type guard ring 410. In addition, the other pair of unit cells 100c and 100d is also surrounded by the p-type guard ring 410.

According to an embodiment, in order to program data '1' in the 0th unit cell 100a of the 0th row (column<0>), a signal of a high level is applied to a WWL<0> line, and a signal of a low level may be applied to a BLOWB<0>. Accordingly, the second PMOS transistor 901 may be turned off, and the fourth NMOS transistor 903 and the first PMOS transistor 210 may be turned on. As the first PMOS transistor 210 and the fourth NMOS transistor 903 are turned on, the PN diode 110a is turned on, and the program voltage may be applied to the common node CN connected to the first PMOS transistor 210. Due to the program voltage applied to the common node CN, the program current may flow in the fuse 130 connected to the common node CN, and the program current may flow to the fourth NMOS transistor 903 through the PN diode 110. Here, as the fuse 130 is blown by the program current, data '1' may be programmed into the unit cell 100a.

As described above, while data '1' is programmed into the 0th unit cell 100a of the 0th column (column<0>) among the plurality of unit cells included in the eFuse cell array 60, the PN diodes included in the other unit cells of the 0th column may serve as a protection device. For example, since the word line driver 40 prevents flowing of the program current by turning off the PN diodes 110b and 110c of the other unit cells 100b and 100c connected to the common node CN0 while programming data '1' in the 0th unit cell 100a, the fuses 130b and 130c of the other unit cells 100b and 100c may be protected from the program voltage applied to the common node CN. The word line driver 40 may control the PN diodes 110b and 110c of the other unit cells 100b and 100c to be turned off by providing a signal of a low level to the write word lines WWL<1> and WWL<127> connected to the other unit cells 100b and 100c.

In the above FIG. 11, there has been described as an example that the 0th unit cell 100a of the 0th column (column<0>) among the plurality of unit cells included in the eFuse cell array, but a program operation on the other unit cells of the 0th column and the unit cells of the other column may also be operated in the same manner as described above.

Figure 12:
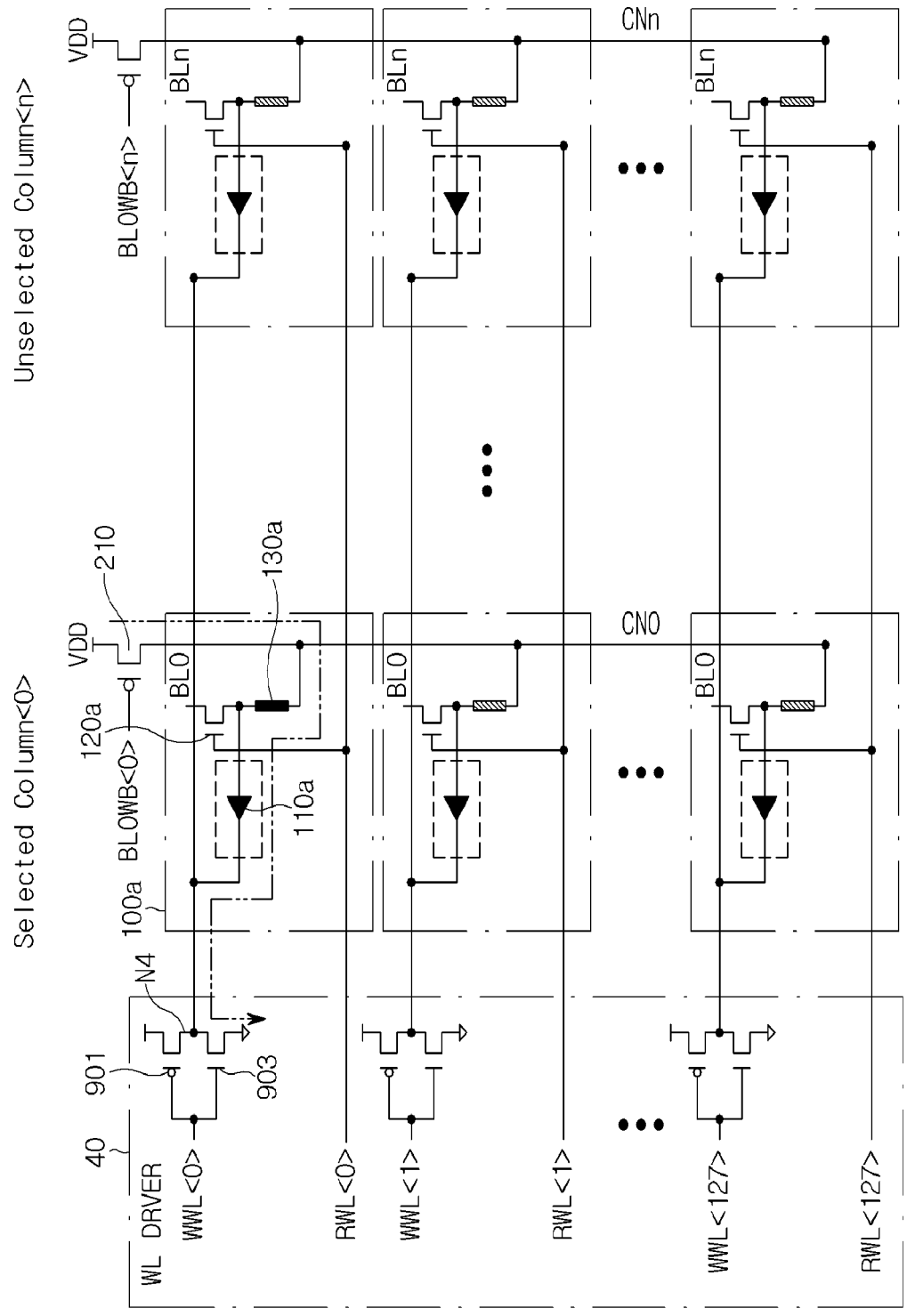
FIG. 12 illustrates an exemplary circuit configuration diagram illustrating a write operation of a non-volatile memory device having a fuse-type cell array according to one or more embodiments of the present disclosure.

FIG. 12 illustrates an exemplary circuit configuration diagram illustrating a write operation of a non-volatile memory device having a fuse-type cell array according to one or more embodiments of the present disclosure.

FIG. 12 is similar to FIG. 11, except that the arrangement shape of the unit cells is slightly different. This is almost similar to FIG. 11, and thus a detailed description thereof will be omitted. In FIG. 12, a WWL<0>, a WWL<1>, a WWL<127>, an RWL<0>, an RWL<1>, an RWL<127>, a selected column<0>, and an unselected column<n> are included. The operating principle of FIG. 12 is similar to that of FIG. 11. However, it is slightly different in an arrangement or order of the WWL<0>, the WWL<1>, the RWL<0>, the RWL<1>, etc.

Figure 13:
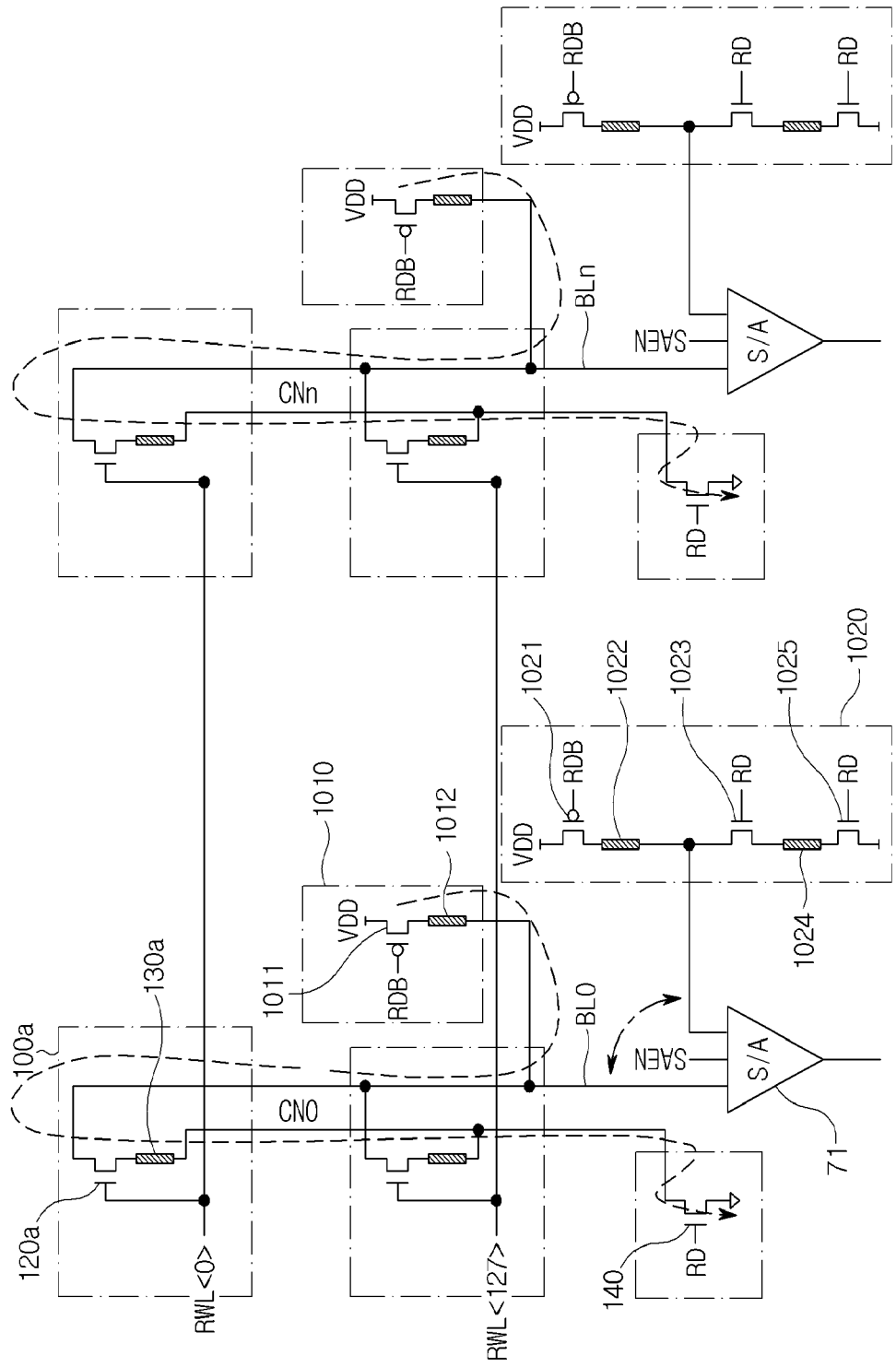
FIG. 13 illustrates an exemplary circuit configuration diagram illustrating a read operation of a non-volatile memory device having a fuse-type cell array according to one or more embodiments of the present disclosure.

FIG. 13 illustrates an exemplary circuit configuration diagram illustrating a read operation of a non-volatile memory device having a fuse-type cell array according to one or more embodiments of the present disclosure.

FIG. 13 illustrates a current flow for the case of reading data programmed into the 0th unit cell 100a of the 0th column (column<0>) among the plurality of unit cells included in the eFuse cell array 60. Since the read operation and the current flow therefor are not associated with the PN diode, the PN diode is omitted in FIG. 13 for convenience of illustration. However, the configuration, connection structure, and operation of the unit cell 100a of FIG. 13 are the same as those described with reference to FIGS. 3 to 10.

According to an embodiment, a read current controller 1010, a reference voltage generator 1020, and a sense amplifier S/A 71 shown in FIG. 13 may be components included in the bit line sense amplifier 70. The bit line sense amplifier 70 including the read current controller 1010, the reference voltage generator 1020, and the sense amplifier S/A 71 may be separately provided for each column.

According to one or more embodiments, the read current controller 1010 of the n-th column of the non-volatile memory may include a third PMOS transistor 1011 and a first reference resistance element 1012 connected in series. A gate of the third PMOS transistor 1011 may be connected to an RDB line, and both ends of the third PMOS transistor 1011 may be connected to a power supply voltage VDD and a first reference resistance element 1012, respectively. The RDB line may be a line configured to provide an inversion signal of the RD signal indicating whether the read mode is present. For example, in the read mode, a signal of a low level may be provided to the RDB line, and not in the read mode, a signal of a high level may be provided to the RDB line. The first reference resistance element 1012 may be connected between the third PMOS transistor 1011 and the bit line of the n-th column.

According to one or more embodiments, the reference voltage generator 1020 of the n-th column may include a fourth PMOS transistor 1021, a second reference resistance element 1022, a fifth NMOS transistor 1023, a third reference resistance element 1024, and a sixth NMOS transistor 1025, sequentially connected in series between the power supply voltage VDD and a first reference voltage (voltage reference, for example, 0V). A gate of the fourth PMOS transistor 1021 may be connected to the RDB line, and gates of the fifth NMOS transistor 1023 and the sixth NMOS transistor 1025 may be connected to the RD line. A second input terminal of the bit line sense amplifier 71 may be connected between the second reference resistance element 1022 and the fifth NMOS transistor 1023.

A first input terminal of the sense amplifier 71 may be connected to a bit line of each column, and a second input terminal of the sense amplifier 71 may be connected to the reference voltage generator 1020 of a corresponding column.

The sense amplifier 71 may be driven based on an SAEN signal, which is a signal for enabling the sense amplifier. When a high level SAEN signal is input, the sense amplifier 71 may sense a voltage difference between the first input terminal and the second input terminal and amplifies the sensed voltage difference, thereby reading data programmed into a designated unit cell. Here, for convenience of description, it is assumed that the designated unit cell is the 0th unit cell 100a of the 0th column (column<0>).

In the read mode, in order to turn on the first NMOS transistor 120a included in the 0th unit cell 100a of the 0th column (column<0>), a signal of a high level may be applied to the RWL<0> line. Also, in the read mode, a signal of high level is applied to the RD line and a signal of a low level is applied to the RDB line, so that the second NMOS transistor 140 and the third PMOS transistor 1011 may be turned on. In this case, the first reference resistance element 1012 and the fuse 130a of the 0th unit cell 100a are connected in series between the power supply voltage VDD and a ground voltage VSS, so that a voltage determined by the first reference resistance element 1012 and the fuse 130a may be applied to the first input terminal of the sense amplifier 71. At this time, the voltage applied to the first input terminal may vary depending on whether the fuse 130a of the 0th unit cell 100a is programmed to have a program resistance value (programmed R) or is not programmed and has an initial resistance value (initial R).

In the read mode, a signal of a high level is applied to the RD line and a signal of a low level is applied to the RDB line, so that the fourth PMOS transistor 1021, the fifth NMOS transistor 1023, and the sixth NMOS transistor 1025 are all turned on. Accordingly, the reference voltage applied to the second input terminal may be a half of (the power voltage (VDD)+the first reference voltage (Voltage Reference). Accordingly, the reference voltage applied to the second input terminal may have a voltage value (half VDD) corresponding to a half of the power supply voltage by the power supply voltage VDD and the first reference voltage of 0V.

The sense amplifier 71 may output, through the output terminal DOUT, a result indicating whether the 0th unit cell 100a is programmed, based on the voltage applied to the first input terminal and the voltage applied to the second input terminal.

In FIG. 13, the 0th unit cell 100a of the 0th column (column<0>) among the plurality of unit cells included in the eFuse cell array 60 has been described as an example, but a read operation on the other unit cells of the 0th column and the unit cells of the other column may also be operated in the same manner as described above.

According to various embodiments of the present disclosure, the area of the fuse-type cell array can be minimized by disposing an even-numbered unit cells and an odd-numbered unit cells to have a symmetrical structure based on the common node of each column. In addition, by disposing a P+ type guard ring surrounding the even-numbered unit cell and the odd-numbered unit cell having a symmetrical structure, the leakage current between adjacent columns can be prevented.

According to various embodiments of the present disclosure, by including the discharge circuit for the common node for each column of the fuse-type cell array, damage to the fuses of the other unit cells due to the current charged in the common node during the program operation of a specific unit cell can be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A memory device comprising:
   an eFuse cell array in which unit cells of different types are alternately disposed,
   wherein each of the unit cells of different types comprises a PN diode, a first NMOS transistor, and a fuse,
   wherein a first type unit cell and a second type unit cell are connected to each other through a common node, and
   wherein the first type unit cell and the second type unit cell are disposed side by side in a horizontal direction relative to the common node to form a bilaterally symmetrical structure.

2. The memory device of claim 1, wherein the first type unit cell and the second type unit cell disposed side by side in the horizontal direction are connected to a same bit line.

3. The memory device of claim 1, further comprising:
   a p-type guard ring disposed to surround the first type unit cell and the second type unit cell.

4. The memory device of claim 1, wherein the fuse is connected between the common node and a first node,
   wherein the first NMOS transistor comprises a gate terminal connected to a read word line (RWL), a drain terminal connected to a bit line, and a source terminal connected to the first node, and
   wherein the PN diode comprises an anode connected to the fuse through the first node and a cathode connected to a write word line bar (WWLB),
   wherein the RWL is a line configured to receive a RWL signal indicating whether a read word line is activated, and
   wherein the WWLB is a line configured to receive a WWLB signal obtained by inverting a write word line (WWL) signal indicating whether a write word line is activated.

5. The memory device of claim 4, further comprising:
   a first PMOS transistor disposed outside the unit cells and configured to supply a program current to the first type unit cell and the second type unit cell through the common node,
   wherein the first PMOS transistor comprises a gate terminal connected to a line configured to receive a BLOWB signal obtained by inverting a fuse blowing signal, a source terminal connected to a power supply voltage, and a drain terminal connected to the common node.

6. The memory device of claim 4, further comprising:
   a second NMOS transistor disposed outside the unit cells and configured to operatively connect the first type unit cell and the second type unit cell to a ground through the common node,
   wherein the second NMOS transistor comprises a gate terminal connected to a line configured to receive an RD signal indicating whether a read mode is present, a drain terminal connected to the common node, and a source terminal connected to the ground.

7. The memory device of claim 1, further comprising:
   a program driver configured to supply a program current to the common node of a selected column among columns of the eFuse cell array; and
   a sense amplifier configured to read data of any one unit cell among unit cells of the selected column based on a voltage of a bit line of the selected column.

8. The memory device of claim 7, further comprising:
   a common node discharge circuit connected to the common node and configured to discharge a voltage charged in the common node based on control signals according to an operation mode of the memory device.

9. The memory device of claim 8, wherein the control signals comprise an RD signal provided from the sense amplifier and indicating whether a read mode is present, and a BLOWB signal obtained by inverting a fuse blowing signal.

10. The memory device of claim 9, wherein the common node discharge circuit comprises:
    a first inverter configured to invert the RD signal and output an inversion signal of the RD signal;
    a NAND gate configured to perform a NAND operation on the inversion signal of the RD signal provided from the first inverter and the BLOWB signal;
    a second inverter configured to invert an output signal of the NAND gate; and
    a third NMOS transistor comprising a gate terminal connected to an output terminal of the second inverter, a drain terminal connected to the common node, and a source terminal connected to a ground, and configured to be turned on/off according to an output signal of the second inverter.

11. The memory device of claim 10, wherein, when the operation mode of the memory device is a standby mode or a '0' program mode, the common node discharge circuit is configured to discharge the voltage charged in the common node by turning on the third NMOS transistor.

12. The memory device of claim 10, wherein, when the operation mode of the memory device is a standby mode or a '0' program mode, the RD signal is a low level and the BLOWB signal is a high level.

13. The memory device of claim 10, wherein the common node discharge circuit is disposed outside the unit cells.

14. A memory device comprising:
    an eFuse cell array comprising unit cells;
    a program driver configured to supply a program voltage to a common node having a connection with unit cells of a selected column among columns of the eFuse cell array; and
    a common node discharge circuit connected to the common node and configured to discharge a voltage charged in the common node by the program voltage based on control signals to prevent damage of fuses of the unit cells connected to the common node according to an operation mode of the memory device.

15. The memory device of claim 14, wherein the control signals comprise an RD signal indicating whether a read mode is present, and a BLOWB signal obtained by inverting a fuse blowing signal.

16. The memory device of claim 15, wherein the common node discharge circuit comprises:
    a first inverter configured to invert the RD signal and output an inversion signal of the RD signal;
    a NAND gate configured to perform a NAND operation on the inversion signal of the RD signal provided from the first inverter and the BLOWB signal;
    a second inverter configured to invert an output signal of the NAND gate; and
    a third NMOS transistor comprising a gate terminal connected to an output terminal of the second inverter, a drain terminal connected to the common node, and a source terminal connected to a ground, and configured to be turned on/off according to an output signal of the second inverter.

17. The memory device of claim 16, wherein, when the operation mode of the memory device is a standby mode or a '0' program mode, the common node discharge circuit is configured to discharge the voltage charged in the common node by turning on the third NMOS transistor.

18. The memory device of claim 16, wherein, when the operation mode of the memory device is a standby mode or a '0' program mode, the RD signal is a low level and the BLOWB signal is a high level.

19. The memory device of claim 16, wherein the common node discharge circuit is disposed outside the unit cells.

20. The memory device of claim 14, wherein each of the unit cells comprises:
- a fuse connected between the common node and a first node;
- a first NMOS transistor comprising a gate terminal connected to a read word line (RWL), a drain terminal connected to a bit line, and a source terminal connected to the first node; and
- a PN diode comprising an anode connected to the fuse through the first node and a cathode connected to a write word line bar (WWLB),
- wherein the RWL is a line configured to receive a RWL signal indicating whether a read word line is activated, and
- wherein the WWLB is a line configured to receive a WWLB signal obtained by inverting a write word line (WWL) signal indicating whether a write word line is activated.

* * * * *